(12) United States Patent
Wu et al.

(10) Patent No.: US 10,680,208 B2
(45) Date of Patent: Jun. 9, 2020

(54) ELECTROLUMINESCENT DEVICE AND DISPLAY PIXEL STRUCTURE USING THE SAME

(71) Applicant: National Taiwan University, Taipei (TW)

(72) Inventors: Chung-Chih Wu, Taipei (TW); Guo-Dong Su, Taipei (TW); Hoang Yan Lin, Taipei (TW); Wei-Kai Lee, Taipei (TW); Yi-Jiun Chen, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 16/529,955

(22) Filed: Aug. 2, 2019

(65) Prior Publication Data

US 2019/0372055 A1    Dec. 5, 2019

Related U.S. Application Data

(60) Continuation-in-part of application No. 15/668,894, filed on Aug. 4, 2017, now Pat. No. 10,483,496, (Continued)

(51) Int. Cl.
*H01L 51/52* (2006.01)
*H01L 27/32* (2006.01)
*H01L 33/60* (2010.01)

(52) U.S. Cl.
CPC .......... *H01L 51/5271* (2013.01); *H01L 27/32* (2013.01); *H01L 27/3246* (2013.01); (Continued)

(58) Field of Classification Search
CPC ................. H01L 51/5271; H01L 27/32; H01L 2251/558; H01L 33/60; H01L 27/3246; H01L 51/5268
See application file for complete search history.

(56) References Cited

U.S. PATENT DOCUMENTS 6,576,930 B2   6/2003  Reeh et al.
6,791,259 B1   9/2004  Stokes et al.
(Continued)

FOREIGN PATENT DOCUMENTS

CN    1882208    12/2006

*Primary Examiner* — Karen Kusumakar
(74) *Attorney, Agent, or Firm* — WPAT, PC

(57) ABSTRACT

The present invention discloses a general, highly effective and scalable extraction-enhancing OLED display pixel structure based on embedding the OLED inside a three-dimensional reflective concave structure selectively filled with a high-index filler material. Such a structure is able to couple as much as possible internally generated photons into the filler region and then redirect otherwise confined light for out-coupling via the reflective concave structure. Ultimately high light extraction efficiency approaching ~80% and excellent viewing characteristics are simultaneously achievable with optimized structures using highly transparent top electrodes. This scheme is scalable and wavelength insensitive, and thus can be generally applied to all red, green, and blue pixel OLEDs in high-resolution full-color displays.

23 Claims, 24 Drawing Sheets

Related U.S. Application Data which is a division of application No. 15/066,515, filed on Mar. 10, 2016, now abandoned.

(60) Provisional application No. 62/764,433, filed on Aug. 3, 2018, provisional application No. 62/177,273, filed on Mar. 11, 2015.

(52) U.S. Cl.
CPC .......... *H01L 33/60* (2013.01); *H01L 51/5268* (2013.01); *H01L 2251/558* (2013.01)

(56) References Cited

U.S. PATENT DOCUMENTS

| | | |
|---|---|---|
| 2005/0072980 A1 | 4/2005 | Ludowise et al. |
| 2007/0120135 A1 | 5/2007 | Soules et al. |
| 2008/0030132 A1* | 2/2008 | Adachi ............... H01L 27/3246 313/506 |
| 2010/0181582 A1 | 7/2010 | Li et al. |
| 2011/0001157 A1 | 1/2011 | McKenzie et al. |
| 2011/0279998 A1 | 11/2011 | Su et al. |
| 2012/0007119 A1 | 1/2012 | Shiobara et al. |
| 2013/0270587 A1 | 10/2013 | Ouderkirk et al. |
| 2014/0027726 A1 | 1/2014 | Choi et al. |
| 2014/0353595 A1* | 12/2014 | Choi ................... H01L 27/3246 257/40 |
| 2015/0001474 A1* | 1/2015 | Park .................... H01L 51/5271 257/40 |
| 2016/0043154 A1 | 2/2016 | Choi et al. |
| 2016/0240746 A1 | 8/2016 | Yun et al. |
| 2016/0293803 A1 | 10/2016 | Kim et al. |

\* cited by examiner

ELECTROLUMINESCENT DEVICE AND DISPLAY PIXEL STRUCTURE USING THE SAME

CROSS REFERENCE TO RELATED APPLICATIONS

This present application claims the benefit of U.S. Provisional Patent Application No. 62/764,433, filed on Aug. 3, 2018. This present application is a continuation-in-part of patent application Ser. No. 15/668,894, filed on Aug. 4, 2017, which is a division of patent application Ser. No. 15/066,515, filed on Mar. 10, 2016, which claims the benefit of U.S. Provisional Patent Application No. 62/177,273, filed on Mar. 11, 2015. All of the above-referenced applications are hereby incorporated herein by reference in their entirety.

FIELD OF THE INVENTION

The present invention pertains to an electroluminescent (EL) device and a display pixel structure using the same, and more particularly pertains to an organic light-emitting device (OLED) of display pixel structures with improved optical out-coupling and their applications.

BACKGROUND OF THE INVENTION

With years of development, organic light-emitting diode (OLED) displays have now penetrated into wide applications, ranging from small-medium displays for smart watches and mobile phones, large TVs, to futuristic flexible and foldable displays. However, despite stringent power consumption requirements in many applications, over years OLED displays still suffer unsatisfactory energy efficiency due to light extraction problems inherent in many light-emitting devices. Approaches have been reported for enhancing light out-coupling of OLEDs, but due to difficulties associated with display image quality, fabrication complexity, and integration compatibility, they in general are not applicable for light extraction of OLED displays.

Active-matrix organic light-emitting diode displays (AMOLEDs) have become one of the major display technologies, due to their various attractive merits for display applications. These include excellent viewing characteristics resulting from their self-emissive nature, vivid and saturated colors, high contrast, fast response, wide operation temperatures, and compatibility with flexible and wearable applications etc. For many AMOLED applications (e.g., mobile and wearable applications), the power consumption is a critical issue and thus achieving the highest possible external quantum efficiency (EQE) of pixel OLEDs is essential. The EQE of an OLED is governed by both the internal quantum efficiency (IQE) of charge-to-photon conversion in the device and the extraction efficiency of internally generated light for external viewing. Substantial progresses have been made in developing emitting materials with high IQE, such as phosphorescent and other triplet-harvesting emitters that can give nearly ideal 100% IQE. However, current AMOLEDs still suffer poor light extraction and far from ideal EQEs.

Approaches have been reported for enhancing light out-coupling of OLEDs, such as microlens arrays, surface textures, scattering media, embedded low-index grids, embedded photonic nanostructures (e.g., grating/corrugation/photonic crystals), and high-index substrates etc. Although these different methods/structures may be useful for OLED lighting and/or bottom-emitting OLED structures, they in general are not readily applicable for light extraction of (top-emitting) AMOLED displays, mainly due to several difficulties associated with display image quality, fabrication complexity, and integration compatibility: (1) the out-coupling structures/effects often lead to leakage/diffusion of pixel emission to neighboring pixels, resulting in pixel blurring that would degrade the display resolution and image quality; (2) the out-coupling structures/effects often cause scattering, diffusive and diffractive optical reflection of incident ambient light and thus degrade display contrast and image quality; (3) the optical out-coupling structures may require advanced and expensive fabrication (e.g., high-resolution nano-fabrication) not so compatible with OLED display structures or manufacturing; (4) furthermore, the extraction enhancement offered by these methods/structures is generally still very limited and may be strongly wavelength and viewing-angle sensitive, not desirable for displays. Due to these difficulties, to date AMOLEDs hardly adopt any effective light out-coupling techniques/structures for boosting efficiencies and power saving, although it is highly desired. Here this invention discloses a general, highly effective and scalable extraction-enhancing OLED display pixel structure based on embedding the pixel OLED inside a three-dimensional (3D) optically reflective concave structure selectively filled with a high-index filler material. Ultimately high light extraction efficiency approaching ~80% is achievable with such a three-dimensional pixel configuration.

Thus to date, a highly effective and feasible light extraction technique/structure that can boost efficiencies and power saving of OLED displays and yet keep image quality is still lacking and remains a grand challenge.

SUMMARY OF THE PRESENT INVENTION

Here this present invention discloses a general, highly effective and scalable extraction-enhancing OLED display pixel structure based on embedding the OLED inside a three-dimensional reflective concave structure selectively filled with a high-index filler material. Such a structure is able to couple as much as possible internally generated photons into the filler region and then redirect otherwise confined light for out-coupling via the reflective concave structure. Ultimately high light extraction efficiency approaching ~80% and excellent viewing characteristics are simultaneously achievable with optimized structures using highly transparent top electrodes. This scheme is scalable and wavelength insensitive, and thus can be generally applied to all red, green, and blue pixel OLEDs in high-resolution full-color displays.

This invention provides a highly effective extraction-enhancing pixel structure design for electroluminescent displays, which is based on: (i) forming the top-emitting pixel electroluminescent device in a three-dimensional optically reflective concave structure, (ii) dispose a high-index filler (propagation) material in the concave structure region, and (iii) using a highly transparent top electrode for the top-emitting electroluminescent device.

The appropriate combination of optical properties of the electroluminescent device materials and layer structures and the filler materials allows coupling as much as possible internally generated electroluminescent photons into the filler region for direct out-coupling or for propagation in the structure, and then use the reflective concave structure to redirect otherwise confined propagation light for out-coupling.

The optically reflective concave structure comprises a first optically reflective surface, and a second optically reflective surface intersecting the first optically reflective surface at an obtuse angle.

In an embodiment, the intersection obtuse angle between the first and second optically reflective surface is preferred to be in the range of 125°-170°.

In another embodiment, the intersection obtuse angle between the first and second optically reflective surface is preferred to be in the range of 140°-170°.

The electroluminescent device comprises a bottom (first) electrode, a top (second) electrode, and functional layers (organic active layers) between electrodes including a light-emitting layer. The bottom (first) electrode of the electroluminescent device may be composed of a metal layer, a combination of metal layers, a combination of metal layer(s) and transparent conducting oxide(s). The top (second) electrode of the electroluminescent device may be composed of a semi-transparent thin metal layer, a combination of thin metal layers, a transparent conductive oxide layer, a combination of transparent conductive oxide layers, a combination of thin metal layer(s) and transparent conducting oxide(s). It may be preferred that the top (second) electrode of the electroluminescent device be composed of a transparent conductive oxide layer, a combination of transparent conductive oxide layers for lower loss and higher optical out-coupling efficiencies.

The first and second optically reflective surfaces may be both formed with the bottom reflective electrode of the electroluminescent device area.

The second optically reflective surfaces may be formed with the top electrode of the electroluminescent device area that comprises reflective metal films.

The electroluminescent area inside the three-dimensional optically reflective concave structure may be defined, e.g. on the first surface, by a patterned interlayer if the second optically reflective surface is conductive.

In certain embodiments, there may be other functional layer(s), e.g., passivation layer between top electrode and the filler material layer etc., and from optical point view, it may be equivalently considered as part of the filler material layer or the top electrode layer, as long as its refractive index is not too different from that of either the top electrode or the filler material, and in general would not significantly alter the results and characteristics to be discussed and disclosed in this invention.

Layer structures of the electroluminescent device area are optimized (e.g. locating the emitters farther away from the reflective metal electrode, e.g. near the second antinode of the reflective metal electrode, to reduce surface plasmon loss) to allow coupling as much as possible electroluminescent photons into the high-index filler region (i.e. as high as possible optical coupling ratio from the electroluminescent region into the filler region).

The ratio between the height of the high-index filler materials layer(s) and the width of the electroluminescent area is preferred to be larger than 0.05.

The electroluminescent device comprises a bottom electrode and a top electrode. Ultimately high light extraction efficiency approaching ~80% and excellent viewing characteristics may be simultaneously achievable with optimized electroluminescent structures, filler materials, highly reflective surface properties, and using highly transparent top electrodes (such as transparent conducting oxide TCO like ITO, IZO etc.). This scheme is general and scalable; the extraction efficiency increases in shrinking the pixel size and thus is particularly advantageous for very high-resolution electroluminescent display.

It may be preferred to have the refractive index of the filler material $n_{filler}$ be larger than [refractive indexes of electroluminescent active layers−0.2] for achieving higher light extraction efficiency.

This scheme is not wavelength sensitive and thus generally applicable to all colors, including red, green, and blue pixel electroluminescent devices in full-color displays.

This scheme is already very effective for extracting most of the electroluminescent emission regardless of dipole orientations, and the use of more horizontal dipole emitters may further boost the electroluminescent pixel light extraction.

The electroluminescent device may contain one or more functional layers including a light emitting layer, wherein the emitting layer contain emitting materials having preferential horizontal emitting dipoles (relative to the layer surface) with the horizontal dipole ratio being larger than 70%.

The high-index filler in the device/pixel structure may be further capped (overcoated or laminated etc.) with one or more layers of some other/additional functional layer(s).

The first layer in such additional functional layer(s) that is in contact with the filler layer may be preferred to have a refractive index $n_{funct} \leq [n_{filler} - 0.2]$.

In certain embodiment, the high-index filler material may be disposed not only mainly into the concave area but also be extend out of the concave area.

The electroluminescent devices may use different types of emitting materials, including organic light emitting material(s), quantum dot light emitting material(s), perovskite light emitting material(s), thin-film electroluminescent materials etc.

In certain embodiments, the thickness of the filler material layer may be smaller, equal to, or larger than the height of the concave structure (or the depth of the concave structure, H). The filler material layer may be a combination of different high-index materials layers.

DETAILED DESCRIPTION OF THE INVENTION

Embodiment 1: Pixel and Device Configurations

Figure 1:
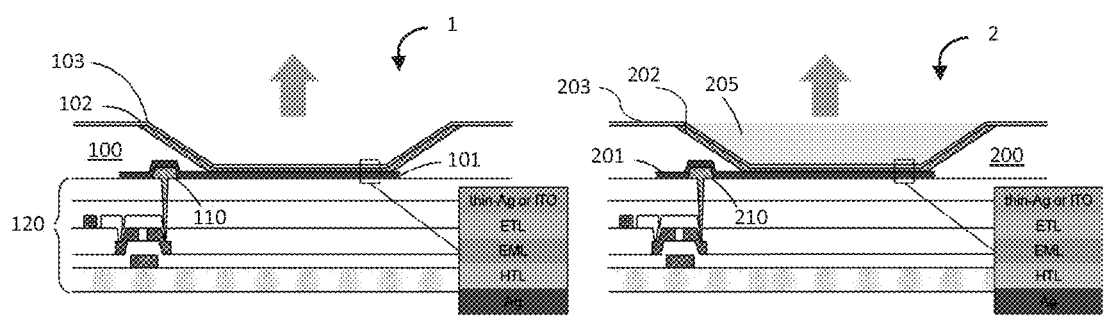
FIG. 1(a) illustrates an electroluminescent device applied in an AMOLED pixel structure with a flat bottom reflective electrode (Ag) and the surrounding dielectric bank.
FIG. 1(b) illustrates another electroluminescent device applied in a 3D AMOLED pixel structure with the selective high-index filler and the bottom reflective electrode (Ag) being extended to the bank slope to form the concave reflector, called the R-bank+filler structure, according to a first embodiment of the invention.
FIG. 1(c) illustrates an electroluminescent device applied in a 3D AMOLED pixel structure along with the addition of the high-index filler, called the D-bank+filler structure, according to a second embodiment of the invention.
FIG. 1(d) illustrates the side view and top view of the pixel structure and feature/dimension definitions according to the embodiments in FIG. 1(b) or FIG. 1(c).
Figure 1:
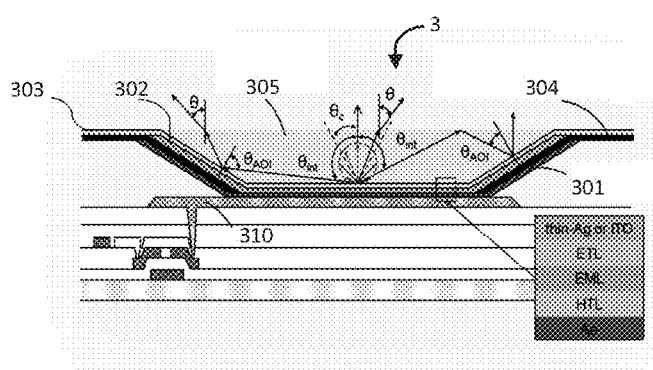
Figure 1:
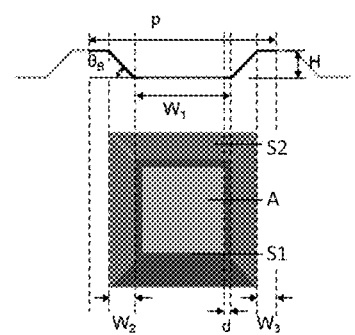

FIG. 1(a) depicts the AMOLED pixel structure 1 with a flat bottom reflective electrode (Ag) and the surrounding dielectric bank. FIG. 1(b) depicts the proposed 3D AMOLED pixel configuration 3 with the selective high-index filler and the bottom reflective electrode (Ag) being extended to the bank slope to form the concave reflector. Different light ray paths illustrate how light rays entering the filler with an initial internal angle $\theta_{int}$ exceeding $\theta_c$ (the total-internal-reflection-TIR critical angle of the filler-air interface) can be re-directed for out-coupling via one or multiple reflection by various reflective surfaces. This structure is called the R-bank+filler structure 3, in which an additional dielectric layer coated over the bank slope portion of the bottom reflective electrode may be needed for insulation and for defining the emission aperture at the bottom surface. FIG. 1(c) depicts the AMOLED pixel structure along with the addition of the high-index filler, called the D-bank+filler structure 2 herein. FIG. 1(d) depicts the side view and top view of the pixel structure and feature/dimension definitions for optical ray-tracing simulation, including the bank height H, the bank angle $\theta_B$, the bottom width $W_1$ of the concave structure, the spacing d between the actual emission area and the bank edge, and the subpixel pitch $p=W_1+2W_2+2W_3$. Insets in panels FIG. 1(a)-(c) show more details of the active layer stack of the OLED with either thin Ag or ITO as the top electrode. Depending on whether thin Ag or ITO is adopted for the top electrode and whether the bank slope surface is coated with reflective Ag, four different structures: thin Ag+R-bank, thin Ag+D-bank, ITO+R-bank, and ITO+D-bank, are studied for light extraction and viewing characteristics.

FIG. 1(a) shows the schematic configuration for an OLED pixel structure 1 in an AMOLED, which usually adopts a top-emitting configuration for a larger emitting aperture. On top of the substrate and the thin-film transistor circuitry (TFT backplane) 120, the OLED pixel 1 in general has a bottom reflective electrode 101 (e.g., Ag), a thick dielectric bank layer 100 (usually a few μm thick) with tapered banks around the emitting aperture for planarization and isolation, OLED active organic layer(s) 102, and top (semi-)transparent electrode 103 (e.g., thin Ag or ITO). The TFT backplane 120 and the bottom reflective electrode 101 are connected by the interconnection 110. In some cases, the top (semi-)transparent electrode 103 may be further overcoated with a thin transparent capping/passivation layer. Due to higher than unity refractive indices (n) and optical losses in OLED organic layers (typically n>1.7), transparent electrodes (typically n>1.8), metallic electrodes, and capping/passivation layers, only less than 20% of generated photons can be out-coupled for viewing in current AMOLEDs. >80% of generated photons remain trapped or lost within the device—either guided in the organic/dielectric/transparent electrode/capping layers (wave-guided modes), or bound as surface plasmon polaritons (SPPs) at the metallic contact. Thus, despite the high IQEs of the latest triplet-harvesting OLEDs, optimization of light extraction provides ample room for performance improvements of AMOLEDs.

In the AMOLED pixel structure shown in FIG. 1(a), other than electrical isolation and planarization, the tapering dielectric bank structure surrounding the emission aperture of the pixel OLED does not have particular optical functionality. The optical out-coupling of the pixel OLED is still dominated by its planar layered structure, and thus the optics (and poor light extraction) of the pixel OLED is similar to that of a two-dimensional planar OLED. However, by making good use of the existed slanted bank structure, one can convert the pixel OLED into a three-dimensional (3D) optical structure bringing tremendous light extraction enhancement.

FIG. 1 (b) illustrates how a 3D OLED pixel structure 3 can be formed through modifying the AMOLED pixel structure in FIG. 1 (a); instead of only at the bottom surface, the bottom reflective electrode 301 (e.g., Ag) is extended to the bank slopes surrounding the emission aperture; the actual emission aperture can be defined by an additional dielectric layer 304 having an opening at the flat bottom surface and having a refractive index matching those of OLED active layers 302 (e.g., SiNx often used in display industry); then the pixel concave area is further filled with a high-index filler material 305 having a refractive index matching or exceeding those of OLED materials. In practice, the filler material (e.g., simply using the OLED active materials) may be selectively deposited into the concave area through tiny openings in a fine shadow mask (i.e., similar to patterned evaporation of OLED emitting layers) or by other patterned deposition methods (e.g., jet printing); it may also simultaneously serve as the passivation/encapsulation (or other functionalities) for the AMOLED pixel. In a configuration like FIG. 1(b) (called R-bank+filler structure 3 hereafter), the OLED emission zone is indeed embedded in an optically reflective concave structure 301 (i.e., a reflective cup structure) with an optical index-matching environment. With such a structure, it is aimed to first couple as much as possible internally generated photons into the high-index filler region and then use the reflective concave structure to redirect otherwise confined light (i.e., light rays entering the filler with an initial internal angle $\theta_{int}$ larger than the total-internal-reflection (TIR) critical angle $\theta_c$ of the filler-air interface) for out-coupling via one or multiple reflection by various surfaces, as illustrated by different light ray paths in FIG. 1(b). In addition to the R-bank+filler structure 3, a pixel structure similar to the general structure except for being also selectively filled with the high-index filler, i.e., the D-bank+filler structure 2 shown in FIG. 1(c), is also illustrated for comparison.

In addition to enhancing light extraction, the proposed structure in FIG. 1(b) is also expected to have the following features/merits: (1) the extraction mechanism is in principle wavelength insensitive, therefore generally good for all R/G/B colors; (2) the structure confines pixel emission mostly within the same pixel and thus shall minimize leakage/diffusion of a pixel emission to neighboring pixels and pixel blurring/mixing problems often seen in other OLED light extraction schemes; (3) there is no major change in optics of incident ambient light (i.e., no scattering/diffusive/diffractive reflection of incident ambient light), and therefore it shall not significantly alter the contrast characteristics of a conventional pixel; (4) requiring no major changes in the current top-emitting AMOLED structure and no nano-scale fabrication, it is good for implementation.

Effects of the described structure on optical out-coupling and overall optical properties, such as the spectral and angular dependence of emission, are quantitatively analyzed with optical simulation. Based on the proposed structure in FIG. 1(b), the pixel structure and corresponding dimension/feature definitions used for optical simulation are shown in FIG. 1(d), including the bank height H, the bank angle $\theta_B$, the bottom width $W_1$ of the concave structure, the spacing d between the actual emission area and the bank edge, and the sub-pixel pitch $p=W_1+2W_2+2W_3$. Assuming H of 2 μm and $\theta_B$ of 30° typical for real AMOLEDs, other representative subpixel dimensions used for simulation in this work are $W_1$=13 μm, d=1 μm, $2W_2$~7 μm, $2W_3$=5 μm, and p=25 μm, to mimic the situation in the real 500-ppi (pixel per inch) high-resolution full-color AMOLED display (having a ~50-μm pixel pitch and 2×2 25-μm square subpixels). Values of $W_1$, H, $\theta_B$ are also varied to examine their influences on light extraction and other optical characteristics. The OLED active layer stacks are assumed to have the general structure of thick reflective Ag bottom electrode (150 nm)/hole-transport layer-HTL (y nm)/emitting layer-EML (10 nm)/electron-transport layer-ETL (x nm)/(semi-)transparent top electrode (either 20 nm Ag or 100 nm ITO), as shown in insets of FIGS. 1(a)-1(c). In simulation, the optical properties (refractive index n) of the typical organic material CBP (n~1.8 at 520 nm) are assumed for all the HTL, EML, ETL, and filler materials. Depending on the top (semi-)transparent electrode adopted (thin Ag or ITO) and the bank optical properties (the R-bank or D-bank with or without reflective Ag coating on the bank slope, respectively), four different structures: thin Ag+R-bank, thin Ag+D-bank, ITO+R-bank, and ITO+D-bank are studied. In different applications, there may be other functional layer(s), e.g., passivation layer between top electrode between the top electrode and the filler material layer etc., and from optical point view, its may be equivalently considered as part of the filler material layer or the top electrode layer, as long as its refractive index is not too different from that of either the top electrode or the filler material, and in general would not significantly alter the results and characteristics to be discussed and disclosed in this invention.

Since the proposed OLED pixel contains structures of very different dimensional scales, i.e., nm-scale structures that are smaller than wavelengths (e.g., thickness of the OLED active layers) and μm-scale structures that are significantly larger than wavelengths (e.g., pixel size, bank height, filler thickness etc.), optical properties of the proposed structure are analyzed with a multi-scale optical simulation. It combines the analytical electromagnetic wave- and dipole-based power dissipation model that is good for dealing detailed emission properties from nm-scale layered structures, with the geometric optics simulation based on Monte Carlo ray tracing that is good for dealing optical properties of larger-scale structures. While more details are given in the descriptions about more details of optical simulation methods of FIGS. 11-13. Here the optical modeling/simulation methods are only outlined: (1) First, with the intrinsic emission spectrum and the emitting dipole orientation of the EML as inputs, the electromagnetic dipole model is used to calculate the coupling of the radiation generated in the OLED active region to the high-index filler region (assumed semi-infinite) as a function of the wavelength λ, polarization (s, p polarization), and initial internal angle $\theta_{int}$ in the filler. Such a distribution is then used to set up the light source for performing the ray-tracing simulation in the macroscopic concave structure. (2) $R_s(\lambda, \theta_{AOI})$ and $R_p(\lambda, \theta_{AOI})$, the optical reflectance seen from the high-index filler as a function of the polarization (s, p), λ, and angle of incidence ($\theta_{AOI}$) for each surface (bottom surface and bank slope) of the concave structure are also calculated with the electromagnetic wave theory. (3) With inputs from (1) and (2), the 3D polarization ray-tracing simulation is then conducted to calculate extraction of the light from the high-index filler region to air as a function of λ and external viewing angle θ

Figure 14:
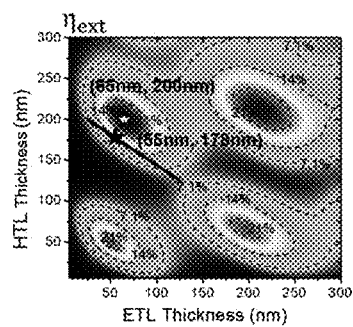
FIG. 14(a) depicts the light extraction efficiencies $\eta_{ext}$ as a function of the HTL and ETL thicknesses for the structure 1 with thin Ag top electrode in FIG. 1(a).
FIGS. 14(b)-14(d) depicts the calculated CIE 1976 (u', v') color coordinates at the 0° viewing angle and the color shift as a function of the HTL and ETL thicknesses for the structure 1 in FIG. 1(a).
FIG. 14(e) depicts the calculated emission spectra vs. external viewing angle for the device with highest $\eta_{ext}$ (25-26%) in FIG. 14(a) (i.e., the hollow star with (ETL, HTL)=(65 nm, 200 nm)).
FIG. 14(f) depicts the calculated emission spectra vs. viewing angle for the device having a lower $\eta_{ext}$ (~16%) compromised with more acceptable color performance (i.e., the black star with (ETL, HTL)=(55 nm, 178 nm) in FIG. 14(a)).
FIG. 14(g) shows CIE 1976 (u', v') color coordinates at different viewing angles corresponding to spectra in FIG. 14(e) and FIG. 14(f).
FIG. 14(h) shows angular dependence of emission intensity for the two devices in FIG. 14(e) and FIG. 14(f), in comparison with the Lambertian pattern.
Figure 14:
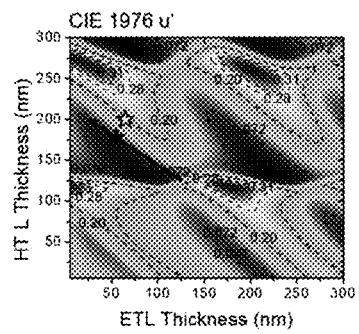
Figure 14:
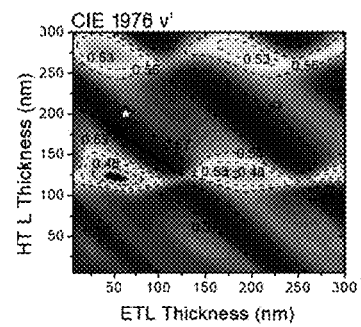
Figure 14:
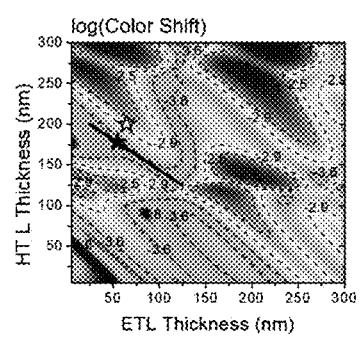
Figure 14:
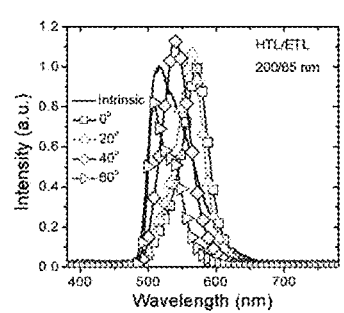
Figure 14:
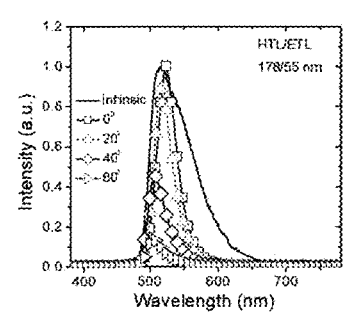
Figure 14:
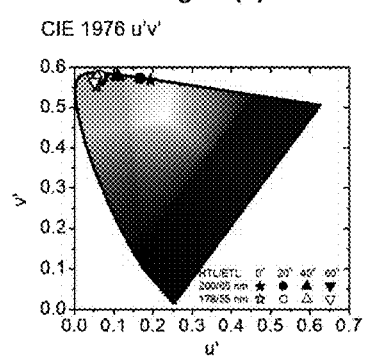
Figure 14:
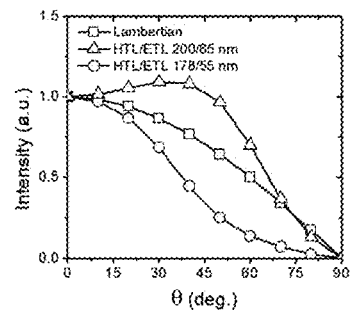
Figure 15:
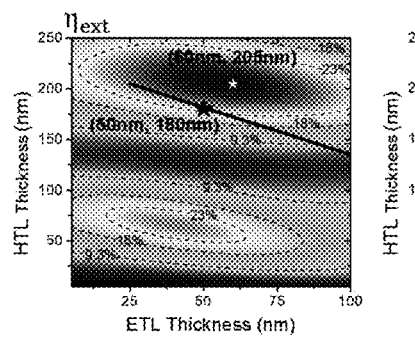
FIG. 15(a) depicts the light extraction efficiencies $\eta_{ext}$ as a function of the HTL and ETL thicknesses for the structure 1 with ITO top electrode in FIG. 1(a).
FIGS. 15(b)-15(d) depicts the calculated CIE 1976 (u', v') color coordinates at the 0° viewing angle and the color shift as a function of the HTL and ETL thicknesses for the structure 1 in FIG. 15(a).
FIG. 15(e) depicts the calculated emission spectra vs. external viewing angle for the device with highest $\eta_{ext}$ (30.3%) in FIG. 15(a).
FIG. 15(f) depicts the calculated emission spectra vs. viewing angle for the device having a lower $\eta_{ext}$ (~23.8%) compromised with more acceptable color performance in FIG. 15(a)).
FIG. 15(g) shows CIE 1976 (u', v') color coordinates at different viewing angles corresponding to spectra in FIG. 15(e) and FIG. 15(f).
FIG. 15(h) shows angular dependence of emission intensity for the two devices in FIG. 15(e) and FIG. 15(f), in comparison with the Lambertian pattern.
Figure 15:
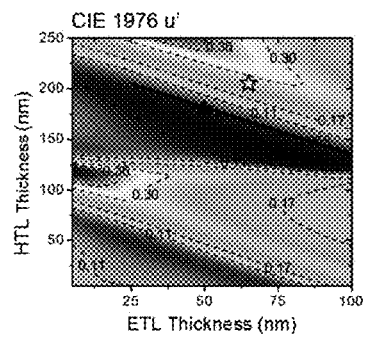
Figure 15:
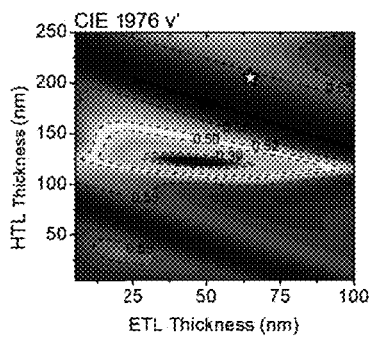
Figure 15:
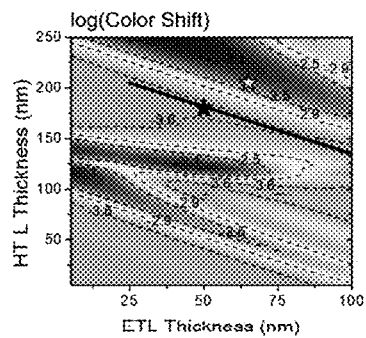
Figure 15:
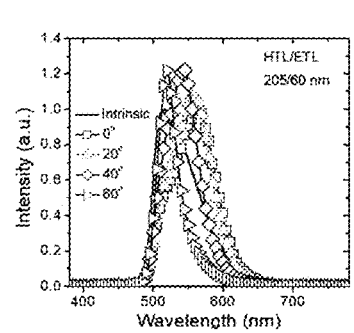
Figure 15:
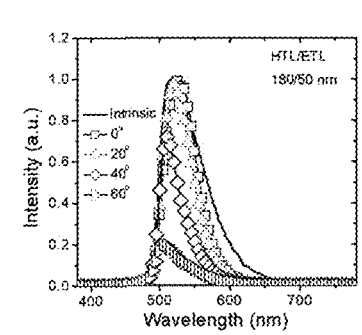
Figure 15:
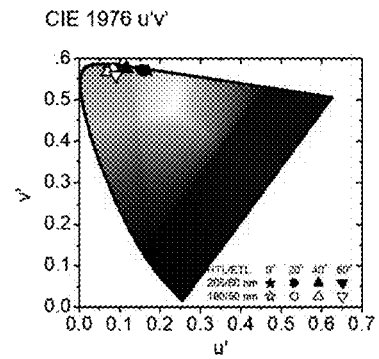
Figure 15:
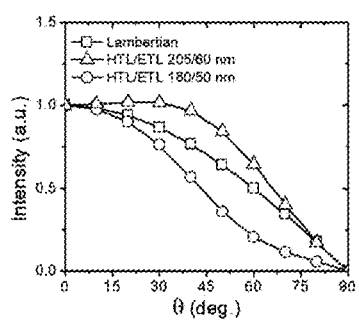

Refer to FIGS. 14 and 15, for comparison and reference purposes, firstly, characteristics of a green top-emitting OLED (dielectric bank, no high-index filler as shown in FIG. 1(a)) currently are used in AMOLED displays, which has a typical structure: reflective Ag bottom electrode (150 nm)/HTL (y nm)/EML (10 nm)/ETL (x nm)/20-nm Ag plus 70-nm CBP capping or 100-nm ITO. Assuming the intrinsic emission spectrum and isotropic emitting dipole orientation (i.e., with a horizontal dipole ratio-HR of 67%) of a typical green phosphorescent emitter Ir(ppy)$_3$ for the EML, in FIGS. 14 and 15 show that the optimal light extraction efficiencies $\eta_{ext}$ of ~25-26% and ~30% can be obtained with HTL/ETL of ~200-205/60-65 nm for thin Ag and ITO devices, respectively. It is noted that higher extraction efficiencies are obtained with locating emitters at the second antinode position relative to the bottom reflective electrode (i.e. thicker HTL), mainly due to suppression of SPP loss to that metal contact. Such a larger HTL thickness indeed is not good for light extraction but maybe also good for considerations of mass production yield and device reliability. Fortunately, current HTL materials should have sufficient conductivity/mobility to allow such a relatively large thickness without sacrificing the driving voltage. For the thin Ag device most used in current commercial AMOLED displays, since the device has a stronger microcavity effect, usually thinner HTL and ETL than optimal extraction conditions (to blue-shift the microcavity resonant wavelength toward the intrinsic peak wavelength) are actually used to obtain more saturated colors and to reduce color shift vs. viewing angles (see FIG. 14). As such, actual $\eta_{ext}$ in commercial AMOLEDs could be lower than 20%. Refer to FIG. 14; for instance, the general thin-Ag top-emitting OLED device having adjusted HTL/ETL thicknesses of 178/55 nm for color/viewing performance exhibits an $\eta_{ext}$ of only ~16%.

Figure 2:
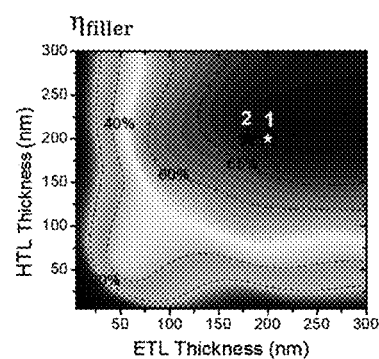
FIGS. 2(a)-2(b) depict the coupling efficiency of the radiation generated in the OLED active region to the high-index filler, as a function of the HTL and ETL thicknesses for the thin Ag device (devices 1, 2) and the ITO device (devices 3), respectively.
FIG. 2(c) depicts the spectrally integrated radiation patterns coupled into the filler region for devices 1, 2, 3.
FIGS. 2(d)-2(f) depict the simulated angle-dependent emission spectra coupled into the filler region for devices 1, 2, 3, respectively.
Figure 2:
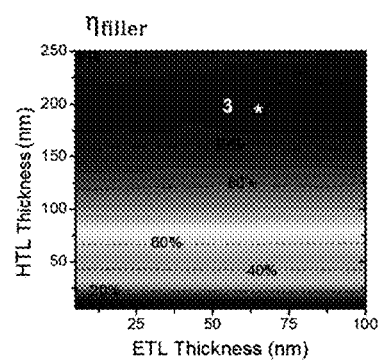
Figure 2:
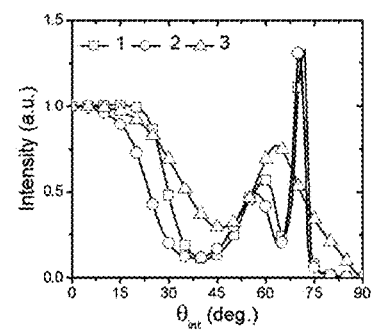
Figure 2:
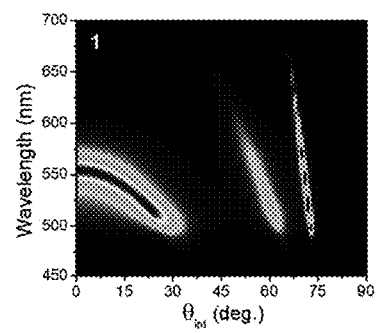
Figure 2:
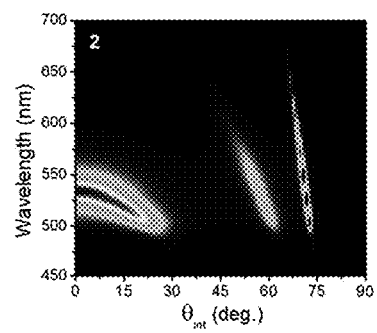
Figure 2:
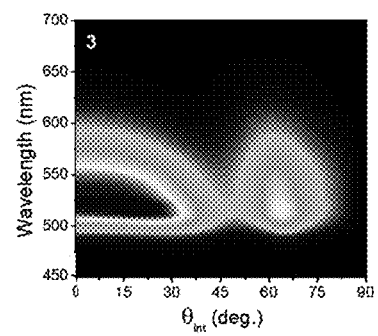

FIGS. 2(a)-(f) depict pixel OLED emission coupled into the high-index filler. FIG. 2 (a) is calculated $\eta_{filler}$, the coupling efficiency of the radiation generated in the OLED active region to the high-index filler, as a function of the HTL and ETL thicknesses for the thin Ag device; i.e. the material of the top (semi-)transparent electrode 103 or 203 (device 1 or 2) is thin Ag: Ag(150 nm)/HTL(y nm)/EML(10 nm)/ETL(x nm)/Ag (20 nm)/CBP (semi-infinite). FIG. 2 (b) is calculated $\eta_{filler}$ for the ITO device; i.e. the material of the top (semi-)transparent electrode 303 (device 3) is ITO: Ag(150 nm)/HTL(y nm)/EML(10 nm)/ETL(x nm)/ITO (100 nm)/CBP (semi-infinite). FIG. 2(c) is spectrally integrated radiation patterns coupled into the filler region for devices 1, 2, 3. FIGS. 2(d)-2(f) are simulated angle-dependent emission spectra coupled into the filler region for devices 1, 2, 3. Isotropic green emitters are assumed in the EML for all calculations.

Optical characteristics of the invented extraction-enhancing structures for a green sub-pixel is discussed as below, again assuming an isotropic green EML. FIG. 2(a)-2(b) show calculated $\eta_{filler}$, the coupling efficiency of the radiation generated in the OLED active region to the high-index filler (assumed semi-infinite), as a function of the HTL and ETL thicknesses for both thin Ag and ITO devices, respectively. Optimal $\eta_{filler}$ of up to ~70% can be obtained for the thin Ag device with thicker HTL and ETL (e.g., both ~200 nm), as SPPs to both metallic contacts are minimized. Meanwhile, significantly higher $\eta_{filler}$ of up to ~88% is seen for the ITO device with thick enough HTL (e.g., ~200 nm), while the ETL thickness has minor effect since ETL, ITO, filler all have similar refractive indexes. The significantly higher $\eta_{filler}$ of the ITO device is mainly associated with its less metal SPP and absorption loss (compared to top thin Ag electrode). Since out-coupled emission observed at an external viewing angle θ would have contribution from different initial internal angles $\theta_{int}$ through re-direction by reflection, initial $\theta_{int}$-dependent emission spectra and colors coupled into the filler need to be considered (see FIG. 16 for details) for obtaining better color performance in out-coupled emission (e.g., more saturated colors at θ=0° and smaller color shift vs. viewing angles). Through detailed analyses of emission characteristics coupled into the filler, two thin Ag devices, device 1 (thicker HTL/ETL of 200/200 nm) having highest $\eta_{filler}$ (~69.8%) and device 2 (thinner HTL/ETL of 200/180 nm) having lower $\eta_{filler}$ (~68.6%) compromised with more acceptable colors at $\theta_{int}$=0 and smaller spectral/color shifts vs. $\theta_{int}$ (see FIG. 16 for details) will be subjected to subsequent analyses. Meanwhile, the ITO device simultaneously having highest $\eta_{filler}$ of ~88% and small angle-dependent spectra in the filler (device 3, with HTL/ETL thicknesses of 195/65 nm) will be further analyzed. FIGS. 2(c)-2(f) show the spectrally integrated emission intensities (s+p polarization; see FIG. 17 for separate p-/s-polarization emission patterns) and emission spectra coupled into the filler as a function of the initial internal angle $\theta_{int}$ for these three devices. There are significant distributions of emission over angles exceeding the filler-air TIR critical angle $\theta_c$~33.5°, which would not be out-coupled if no effective extraction scheme is adopted. Variation of emission spectra vs. $\theta_{int}$ is significant in device 1 and is reduced in device 2 as expected, while nearly negligible in device 3 due to its very weak microcavity effect. Results of FIGS. 2(c)-2(f) and FIG. 17 are then used to set up the polarization-, angle-, and wavelength-dependent light ray sources for performing the ray-tracing simulation in the larger-scale concave structure.

Figure 18:
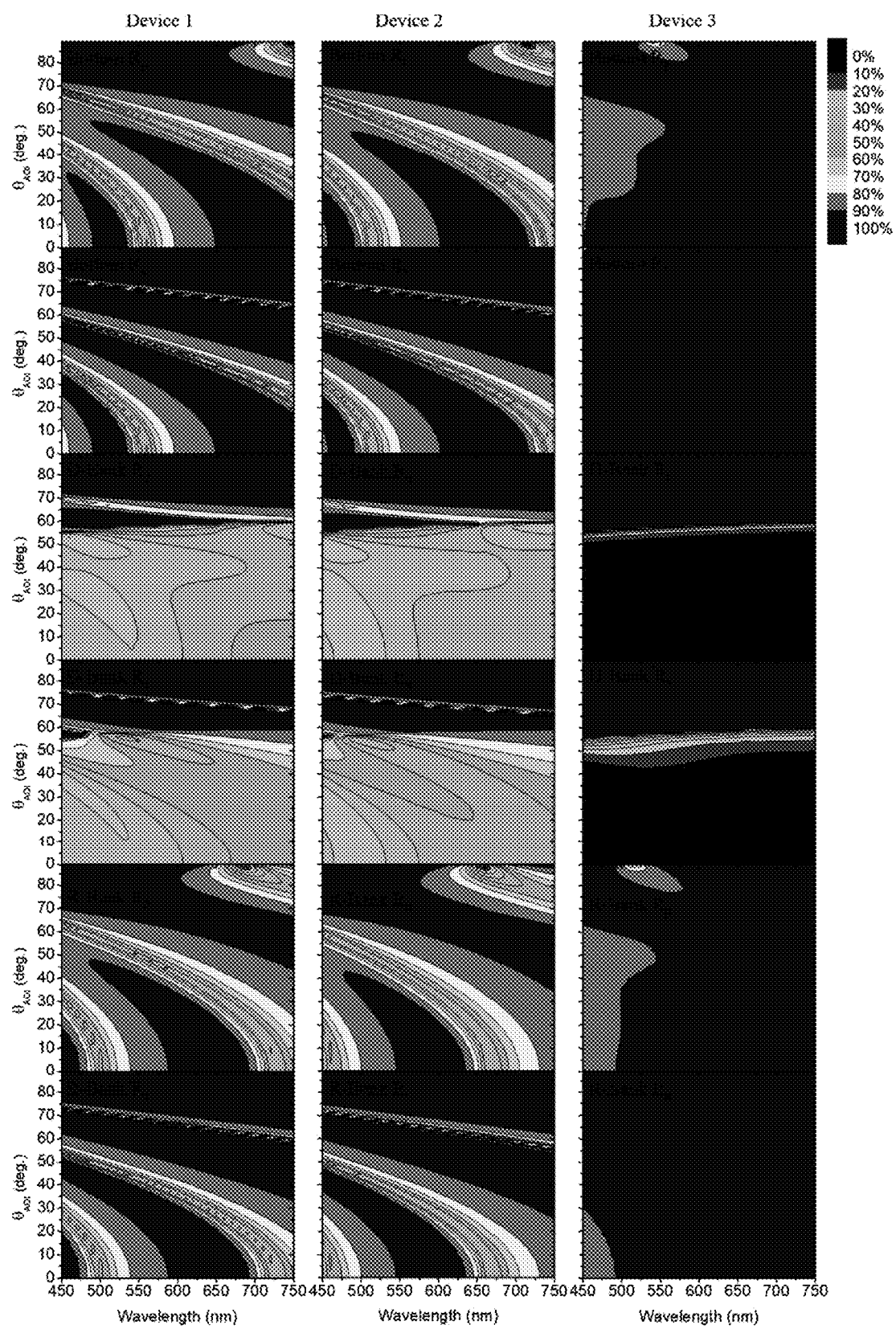
FIG. 18 depict s optical reflection properties of surfaces in various bank+filler structures.

$R_s(\lambda, \theta_{AOI})$ and $R_p(\lambda, \theta_{AOI})$ seen from the filler for each surface (bottom surface and bank slope) of the R-bank/D-bank structures containing thin Ag devices 1-2 and ITO device 3 are calculated with the analytical electromagnetic wave theory and corresponding layer structures, with calculation methods and calculated results being detailed and shown in FIG. 18. In summary, for all three device structures (Devices 1-3), both bottom surfaces and R-bank slopes generally show high reflection, while the ITO device exhibits the most homogeneous and highest reflection (>90%) over $\theta_{AOI}$, s/p polarizations, and λ. For the D-bank slope surfaces, the ITO Device 3 exhibits consistently low reflection (<5%), except for $\theta_{AOI}$ exceeding the TIR critical angle. Meanwhile, the layer stacking of the thin Ag Devices (Devices 1 or 2) on the D-bank slope could result in certain reflection below the TIR critical angles, due to presence of the (more reflective) thin Ag top electrode.

Figure 19A:
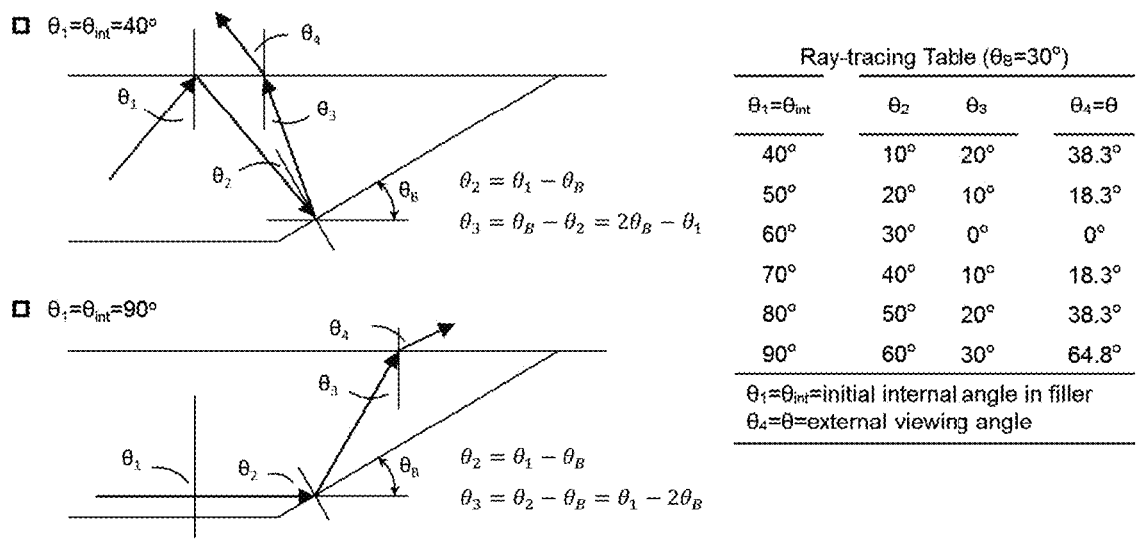
FIGS. 19(a)-19(b) depict the illustration of re-direction and bouncing reflection of light rays in the bank+filler structure.

With light ray sources and surface optical properties set up using results of previous sections, the 3D polarization ray-tracing simulation is then conducted to calculate the light extraction efficiency from the filler to air, $\eta_{air}$.[36,37] Calculated $\eta_{air}$ for various devices in different pixel structures are listed in Table 1. High $\eta_{air}$ of ~69-83% is obtained for green-emitting devices (including thin Ag Devices 1-2 and ITO Device 3) with the R-bank+filler structure ($\theta_B$=30°, H=2 μm, $W_1$=13 μm). Such high $\eta_{air}$ can be achieved mainly because with appropriate bank angle $\theta_B$ (e.g., 30°), light rays with any initial $\theta_{int}$>$\theta_c$ can all be successfully re-directed into the <$\theta_c$ escape cone for out-coupling (see FIG. 19(a) for detailed illustration). Highest $\eta_{air}$ of 83% obtained from the ITO+R-bank device (device 3 vs. devices 1, 2) is mainly due to its higher reflection (thus lower reflection loss) of all the surfaces (see FIG. 18) and also negligible absorption loss of the top transparent electrode (compared to thin Ag), since the light not directly escaping would undergo bouncing reflections between surfaces/interfaces before being lost or re-directed for eventual out-coupling. Without high-reflection coating on the bank slope surface (i.e., D-bank+filler structure), the ITO device exhibits low $\eta_{air}$ of 30%. Interestingly, two thin Ag+D-bank devices (1, 2) could still show moderate $\eta_{air}$ of 48-52%, not surprising since thin Ag top electrode coated over bank slopes could provide certain reflection (see FIG. 18).

TABLE 1

Light coupling/extraction efficiencies under various structures/conditions.

| Device | Bank | Color | HR | $\eta_{filler}$ (%) | $\eta_{air}$ (%) | $\eta_{ext}$ (%) |
|---|---|---|---|---|---|---|
| 1 | D | Green | 67 | 69.8 | 51.6 | 36.0 |
|   | R |       |    |      | 70.6 | 49.2 |
| 2 | D | Green | 67 | 68.6 | 47.8 | 32.8 |
|   | R |       |    |      | 68.7 | 47.1 |
| 3 | D | Green | 67 | 87.8 | 30.5 | 26.7 |
|   | R |       |    |      | 82.6 | 72.6 |
| 3 | D | Red   | 67 | 93.7 | 29.4 | 27.5 |
|   | R |       |    |      | 85.9 | 80.5 |
| 3 | D | Blue  | 67 | 83.5 | 30.1 | 25.2 |
|   | R |       |    |      | 80.2 | 66.9 |
| 1 | R | Green | 100 | 70.2 | 77.7 | 54.5 |
| 3 | R | Green | 100 | 88.4 | 86.2 | 76.2 |

$\theta_B$ = 30°, H = 2 μm, $W_1$ = 13 μm

With $\eta_{filling}$ and $\eta_{air}$, the overall optical extraction efficiencies $\eta_{ext}$ (=$\eta_{filling}$×$\eta_{air}$) for thin Ag Devices 1-2 and ITO Device 3 in R-bank/D-bank structures are obtained and summarized in Table 1. In the D-bank+filler structure, not much enhancement in $\eta_{ext}$ is seen for devices 3; yet device 1 and 2 show more significant enhancement in $\eta_{ext}$ (~33-

36% vs. ~16-24% of the color-compromised general top-emitting pixel device as detailed in FIGS. 14 and 15) with its sufficient $\eta_{filling}$ and $\eta_{air}$. In contrast, all devices 1-3 in the R-bank+filler structure exhibit significantly high $\eta_{ext}$ of 49.2%, 47.1%, and 72.6%, respectively (cf. the D-bank+filler structure and general top-emitting OLED). In particular, the ITO device in the R-bank+filler structure gives extremely high $\eta_{ext}$ of ~73%, which is 4-5 times higher than that (~16%) of current top-emitting AMOLED pixels. Such high $\eta_{ext}$ could reduce power consumption of an AMOLED by nearly a factor of five, which is significant for various mobile and power-aware applications.

Figure 3:
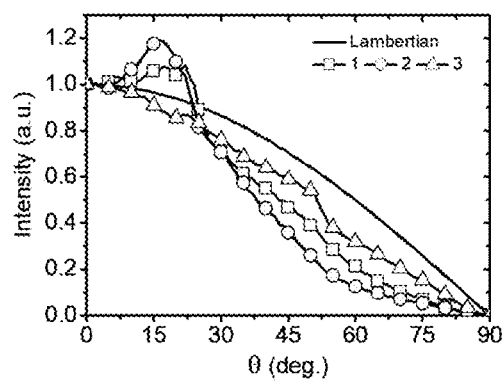
FIG. 3(a) depicts viewing-angle dependent (spectrally integrated) out-coupled emission intensity for thin Ag Devices 1-2 and ITO Device 3 in the R-bank+filler structure.
FIGS. 3(b)-3(d) depict viewing-angle dependent out-coupled emission spectra for devices 1-3 in the R-bank+filler structure, respectively.
Figure 3:
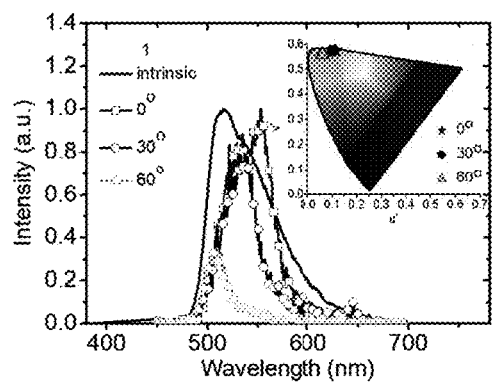
Figure 3:
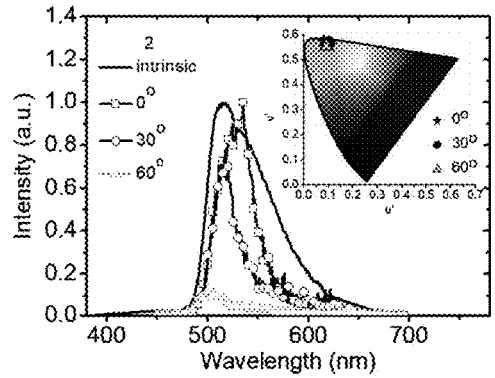
Figure 3:
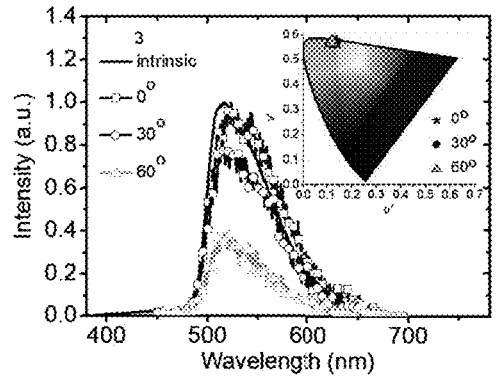

FIG. 3(a)-3(d) depict out-coupled pixel OLED emission for R-bank+filler structures. H=2 μm, $\theta_B$=30°, $W_1$=13 μm, d=1 μm, $2W_2$~7 μm, $2W_3$~5 μm, p=25 μm are assumed. FIG. 3 (a) depicts viewing-angle dependent (spectrally integrated) out-coupled emission intensity for thin Ag Devices 1-2 and ITO Device 3 in the R-bank+filler structure. The Lambertian pattern is also shown for comparison. FIG. 3(b)-3(d) depict viewing-angle dependent out-coupled emission spectra for thin Ag Devices 1-2 and ITO Device 3 in the R-bank+filler structure. The intrinsic emission spectrum of the isotropic green emitter in EML is also shown for comparison.

Figure 20:
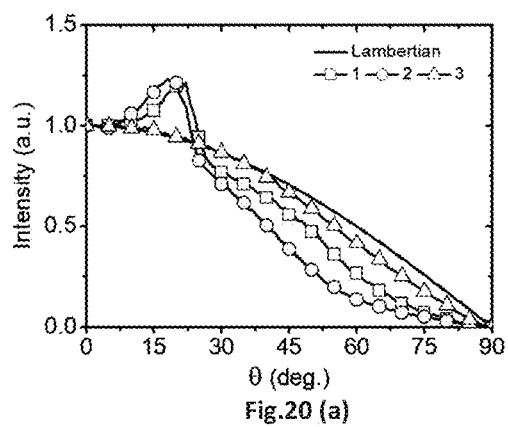
FIG. 20(a) depicts viewing-angle dependent (spectrally integrated) out-coupled emission intensity for thin Ag Devices 1-2 and ITO Device 3 in the D-bank+filler structure.
FIGS. 20(b)-20(d) depict viewing-angle dependent out-coupled emission spectra for devices 1-3 in the D-bank+filler structure, respectively.
Figure 20:
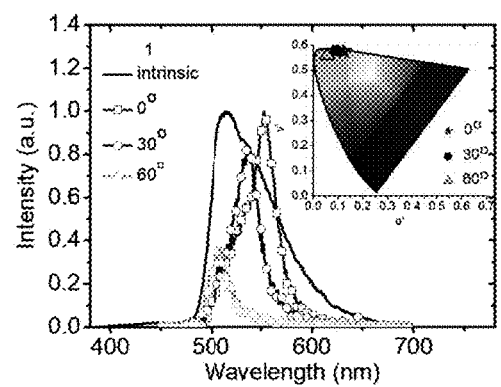
Figure 20:
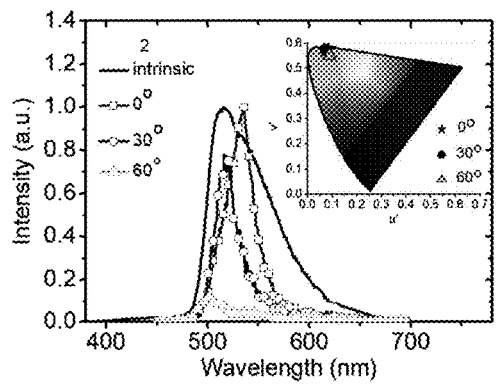
Figure 20:
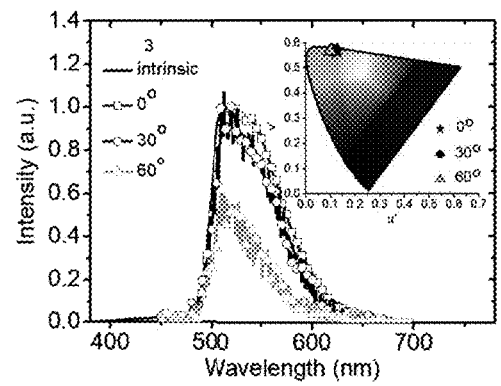

FIG. 3(a)-3(d) depict the calculated angle-dependent emission intensities (cf. the Lambertian pattern) and emission spectra (cf. emitter's intrinsic emission spectrum) for thin Ag Devices 1-2 and ITO Device 3 in the R-bank+filler structure (see FIG. 20 for results of the D-bank+filler structure). Although thin Ag Device 1 in the R-bank+filler structure could give much higher $\eta_{ext}$ than general top-emitting OLED, it shows significant variation of emission spectra/colors vs. viewing angles and also some stronger smaller-angle features in the emission pattern, both indeed reflecting its initial $\theta_{int}$-dependent emission spectra and intensity in the filler (FIG. 2(c)-2(d) and FIG. 17), the re-direction of larger-angle radiation toward smaller angles (e.g., peaks around $\theta_{int}$~60 and 70° being re-directed to $\theta_{int}$~0° and 180, respectively; see FIG. 19(a)), and its superposition onto original smaller-angle radiation. Thin Ag device 2 in the R-bank+filler structure exhibits more directed emission and yet reduced color shift vs. angles (cf. device 1). Most importantly, the ITO device (device 3) exhibits an emission pattern closest to the Lambertian profile and also negligible color shift over angles, both being highly desired for high-end display applications. Such nice viewing characteristics together with its extremely high $\eta_{ext}$ makes the ITO top electrode+R-bank+filler structure the ideal pixel structure and technology for high efficiency (low power consumption) and high image quality OLED displays.

Embodiment 2: Varied Pixel Structure Parameters

Figure 4:
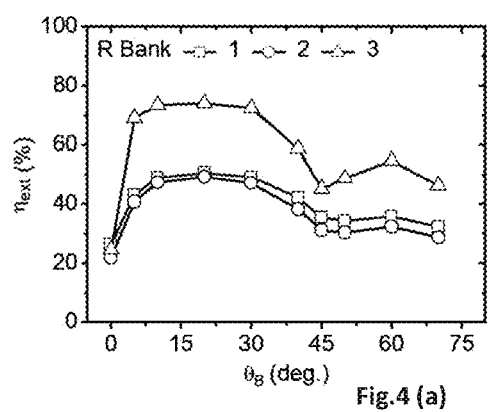
FIGS. 4(a)-4(c) depict the influences of structures for devices 1-3 in the R-bank+filler structure on out-coupling efficiency $\eta_{ext}$ as a function of the bank angle $\theta_B$, the bank height H and the bottom width $W_1$, respectively.
FIG. 4(d) depicts the out-coupling efficiency $\eta_{ext}$ as a function of $H/W_1$ for devices 3 of different $W_1$, to show that $\eta_{ext}$ is universally governed by the $H/W_1$ aspect ratio.
Figure 4:
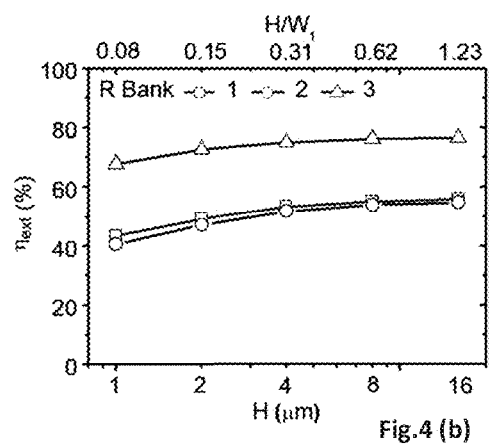
Figure 4:
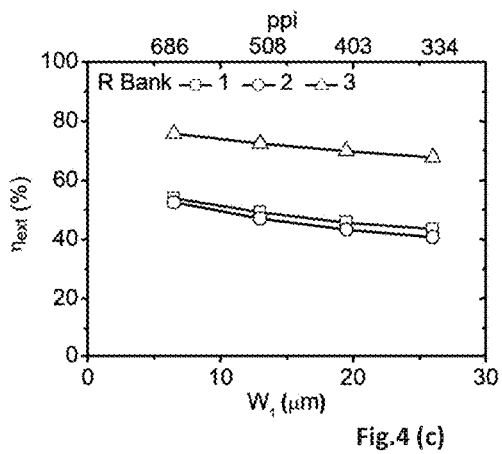
Figure 4:
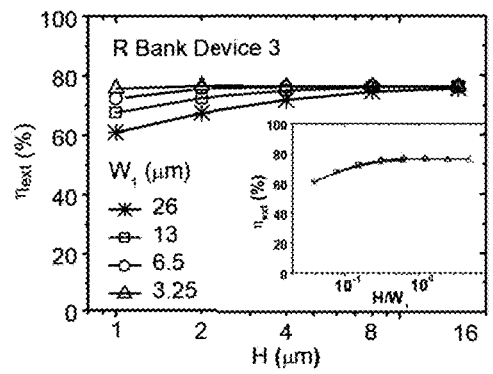

FIG. 4(a)-4(d) depict influences of structures on out-coupling efficiency in the R-bank+filler structure. FIG. 4 (a) is calculated $\eta_{ext}$ as a function of the bank angle $\theta_B$ for thin Ag devices 1-2 and ITO device 3, with $W_1$=13 μm, H=2 μm. FIG. 4(b) is calculated $\eta_{ext}$ as a function of the bank height H for thin Ag devices 1-2 and ITO device 3, with $W_1$=13 μm, $\theta_B$=30°. FIG. 4(c) is calculated $\eta_{ext}$ as a function of the bottom width $W_1$ for thin Ag devices 1-2 and ITO device 3, with H=2 μm, $\theta_B$=30°. Assume isotropic green emitters in all devices. FIG. 4(d) is calculated $\eta_{ext}$ as a function of the bank height H for ITO devices 3 having different $W_1$ of 26, 13, 6.5, 3.25 μm, and $\theta_B$=30°. The inset of FIG. 4(d) depicts $\eta_{ext}$ as a function of H/$W_1$ for devices 3 of different $W_1$, to show that $\eta_{ext}$ is universally governed by the H/$W_1$ aspect ratio, not the absolute H value.

Figure 19B:
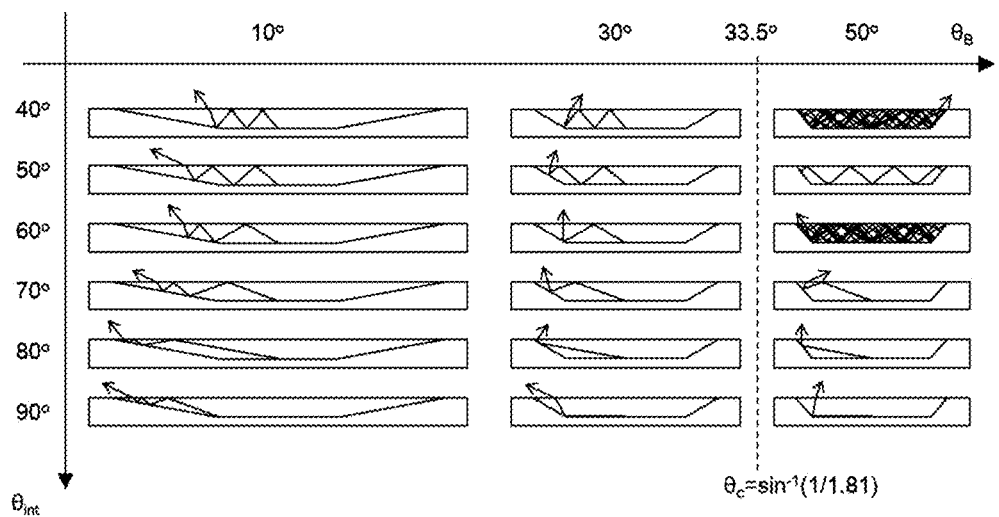
Figure 23A:
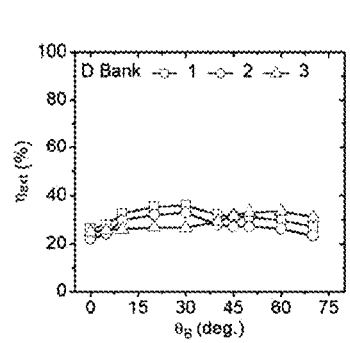
FIGS. 23(a)-23(c) depict the calculated $\eta_{ext}$ as a function of the bank angle $\theta_B$, the bank height H and the bottom width $W_1$ for device 1-3 in the D-bank+filler structure, repectively.
Figure 23B:
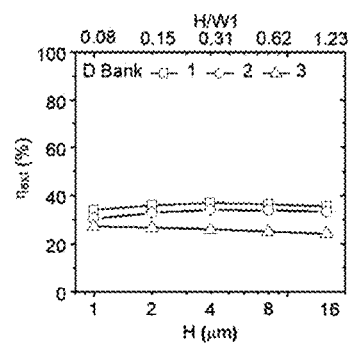
Figure 23C:
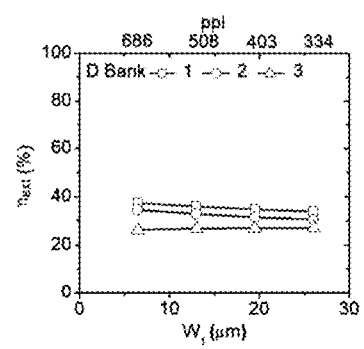

Different pixel structure parameters influence on light extraction $\eta_{ext}$, such as the bank angle $\theta_B$, the bank height H, and the pixel size (mainly R-bank results here; see FIG. 23 for D-bank results). FIG. 4(a) shows $\eta_{ext}$ as a function of $\theta_B$ for thin Ag devices 1-2 and ITO device 3 in the R-bank+filler structure (with other parameters fixed). Clearly, a $\theta_B$ of 10-40° is most effective and optimal for re-directing larger-angle light in the filler for out-coupling, while the gain is less optimized at larger or smaller $\theta_B$. For ITO device 3, highest $\eta_{ext}$ of 74% is obtained at $\theta_B$~20°. Generally speaking, with an appropriate $\theta_B$ (e.g., 10-30°), light rays with initial $\theta_{int}>\theta_c$ can be effectively re-directed into <$\theta_c$ for out-coupling with least numbers of reflection in the structure (see FIG. 19(b) for detailed illustrations of various light ray paths in the structures with different $\theta_B$). FIG. 4(b) shows $\eta_{ext}$ as a function of H, which shows an increasing trend vs. H. For device 3, an $\eta_{ext}$ of >75~76% can be obtained with H≥4 μm. It is quite understandable since a larger bank height (thus larger filler depth and larger H/$W_1$ aspect ratio) would reduce the number of bouncing reflections and corresponding optical loss in the bank+filler structure. Similarly, FIG. 4(c) shows $\eta_{ext}$ as a function of the pixel size (by varying emission aperture $W_1$, corresponding to different display ppi resolutions). The smaller the pixel ($W_1$, i.e., higher ppi), the more effective the R-bank+filler structure for enhancing light extraction. It is a highly favorable advantage of the current extraction scheme for future development of even higher-resolution AMOLEDs. Finally, When combining all the favorable conditions (e.g., $\theta_B$~20°, $W_1$~6.5 μm, H≥4 μm), the device 3 in the R-bank+filler structure can give an $\eta_{ext}$ as high as ~78%.

Embodiment 3: Varied Refractive Index of the Filler Material

Figure 5:
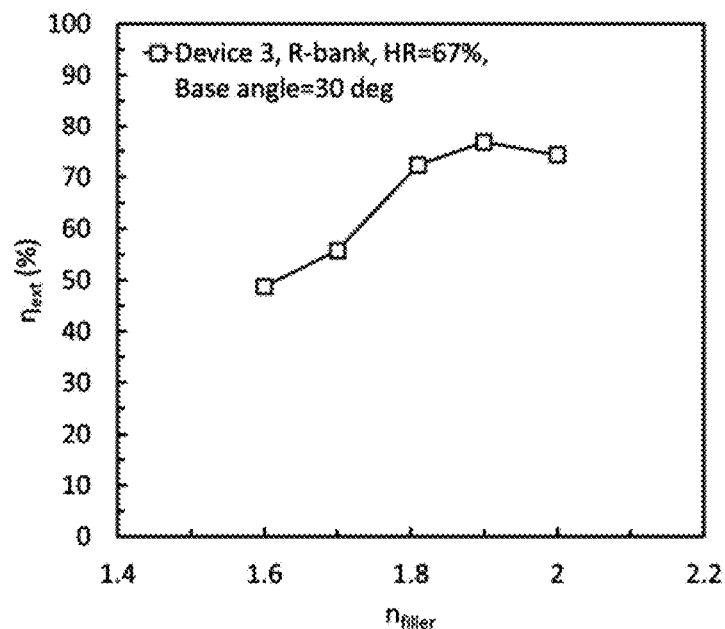
FIG. 5 shows the out-coupling efficiency $\eta_{ext}$ for devices 3 (ITO device) in the R-bank+filler structure as a function of the refractive index $n_{filler}$ of the filler layer for isotropic green emitter.

Varied refractive indexes of the filler material influence on light extraction $\eta_{ext}$. FIG. 5 shows $\eta_{ext}$ for devices 3 (ITO device) in the R-bank+filler structure as a function of the refractive index $n_{filler}$ of the filler layer for isotropic green emitter, HR=67%, $W_1$=13 μm, H=2 μm, $\theta_B$=30° case. It is seen that $\eta_{ext}$ achieves optimal values around $n_{filler}$≥refractive indexes of OLED active layers (n), and drops evidently as $n_{filler}$ decreases below refractive indexes of OLED active layers (assuming n~1.8). This is mainly because the optical coupling efficiency $\eta_{filler}$ from the OLED emitting layers to the filler layer drops as $n_{filler}$ decreases below refractive indexes of OLED emitting layers. Thus to achieve optimal possible $\eta_{ext}$, it is preferred to keep $n_{filler}$≥(refractive indexes of OLED active layers)−0.2. In the preferred embodiment, the refractive index $n_{filler}$ of the filler layer is from 1.82 to 1.88.

Embodiment 4: Different Emitting Colors

Figure 24:
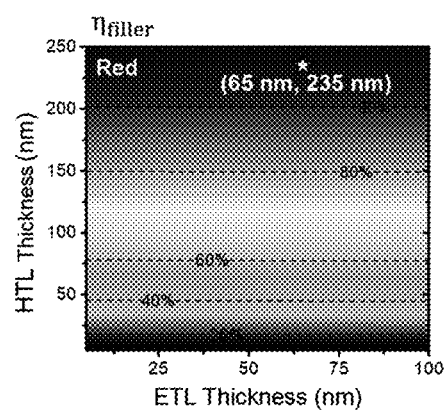
FIG. 24(a) depicts the calculated $\eta_{filler}$, the coupling efficiency of the radiation generated in the active region to the high-index filler, as a function of the HTL and ETL thicknesses for the red-emitting device with the ITO top electrode in the R-bank+filler structure.
FIG. 24(b) depicts the spectrally integrated radiation patterns coupled into the filler region for the red-emitting device with the ITO top electrode in the R-bank+filler structure with highest $\eta_{filler}$.
FIGS. 24(c)-24(d) depict viewing-angle dependent out-coupled emission spectra and out-coupled viewing-angle dependent (spectrally integrated) emission intensity for the highest $\eta_{filler}$ red-emitting device, respectively.
Figure 24:
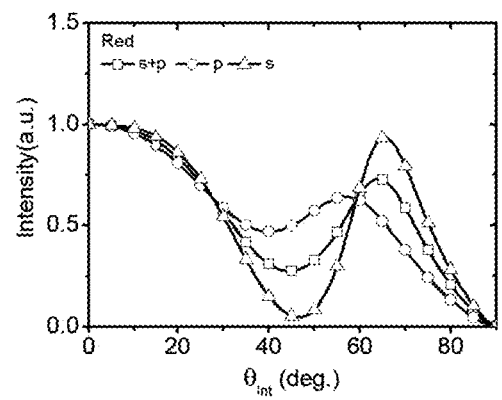
Figure 24:
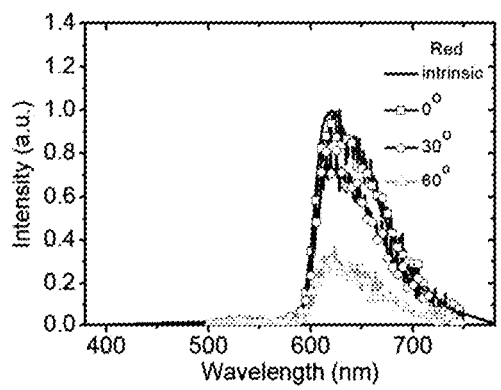
Figure 24:
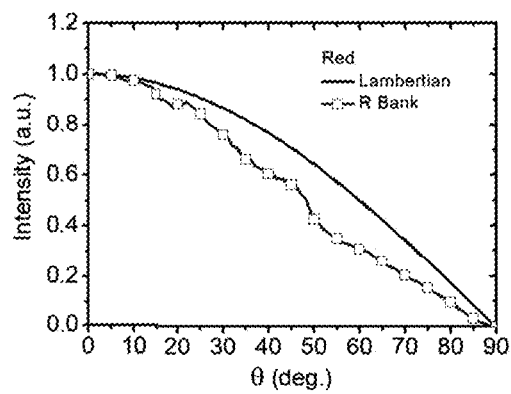
Figure 25:
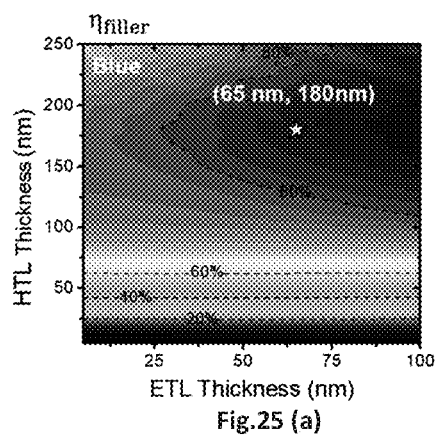
FIG. 25(a) depicts the calculated $\eta_{filler}$, the coupling efficiency of the radiation generated in the active region to the high-index filler, as a function of the HTL and ETL thicknesses for the blue-emitting device with the ITO top electrode in the R-bank+filler structure.
FIG. 25(b) depicts the spectrally integrated radiation patterns coupled into the filler region for the blue-emitting device with the ITO top electrode in the R-bank+filler structure with highest $\eta_{filler}$.
FIGS. 25(c)-25(d) depict viewing-angle dependent out-coupled emission spectra and out-coupled viewing-angle dependent (spectrally integrated) emission intensity for the highest $\eta_{filler}$, blue-emitting device, respectively.
Figure 25:
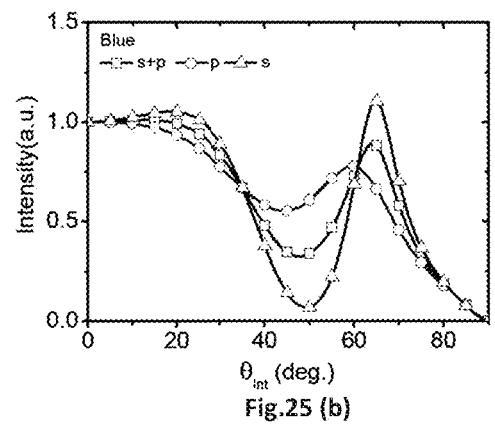
Figure 25:
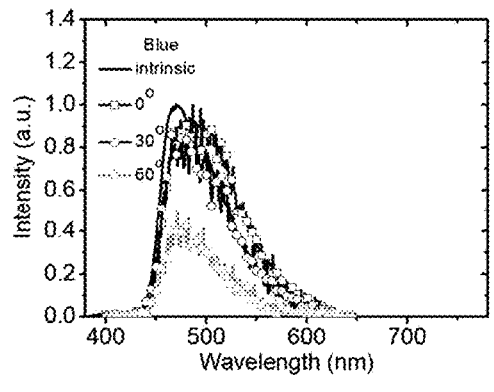
Figure 25:
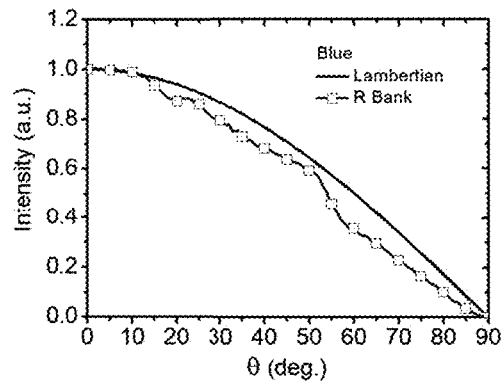

To examine whether the light extraction scheme can be extended to red and blue subpixels of full-color AMOLEDs as well, similar analyses were conducted for red and blue subpixels in the ITO+R-bank+filler structure (device 3-like, with $W_1$=13 μm, H=2 μm, $\theta_B$=30°), using hypothetical red and blue emission spectra for the EML (by shifting the intrinsic emission spectrum to 620 nm and 470 nm, respectively, see FIGS. 24-25 for details of simulation and results). Optimized $\eta_{filler}$, $\eta_{air}$ and $\eta_{ext}$ obtained for red and blue devices are (93.7%, 85.9%, 80.5%) and (83.5%, 80.2%, 66.9%), respectively (Table 1, FIGS. 24-25). Similarly high $\eta_{ext}$ of 67-81% achievable for all red, green, and blue subpixels clearly demonstrates that the light extraction scheme and mechanism here are not sensitive to emission wavelengths and are generally applicable to different colors.

Embodiment 5: Varied Emitting Dipole Orientations

So far, emitters in the OLEDs are assumed isotropic with a horizontal dipole ratio HR of 67%. One of recent trends is to develop OLED emitting materials with more preferentially horizontal emitting dipoles (i.e., with >67% horizontal dipole ratios), so that the radiation patterns inside the OLED is more favorable for direct out-coupling, the loss or trapping to waveguided/SPP modes is reduced, and the light extraction from a planar OLED can be enhanced even without adopting any optical out-coupling structures. For instance, for the general top-emitting green device (thin Ag or ITO as shown in FIG. 1(a)), the light extraction efficiency $\eta_{ext}$ compromised with viewing/color performance can be enhanced to some degree from 16-24% (for isotropic emitters) to ~34% by adopting purely horizontal dipole emitters with HR=100% (see FIGS. 26-27 for details). However, even with perfectly horizontal emitting dipoles, $\eta_{ext}$ for general top-emitting OLEDs is still far from ideal, not to mention that highly horizontal dipole emitters simultaneously with high emission efficiency are yet to be realized. When replacing the isotropic green emitter with the ideal 100% horizontal dipole emitters in the ITO+R-bank+filler structures (with representative $W_1$=13 µm, H=2 µm, $\theta_B$=30°), the optimized $\eta_{filler}$, $\eta_{air}$ and $\eta_{ext}$ slightly rise to (88.4%, 86.2%, 76.2%), respectively, compared to (87.8%, 82.6%, 72.6%) of the isotropic case (see Table 1 and FIG. 28). Such results clearly indicate the R-bank+filler structure is already very effective for extracting most of the OLED emission regardless of dipole orientations, and the use of more horizontal dipole emitters may further boost the OLED pixel light extraction.

Embodiment 6: Disposition of Other Functional Layers on Top

Figure 6:
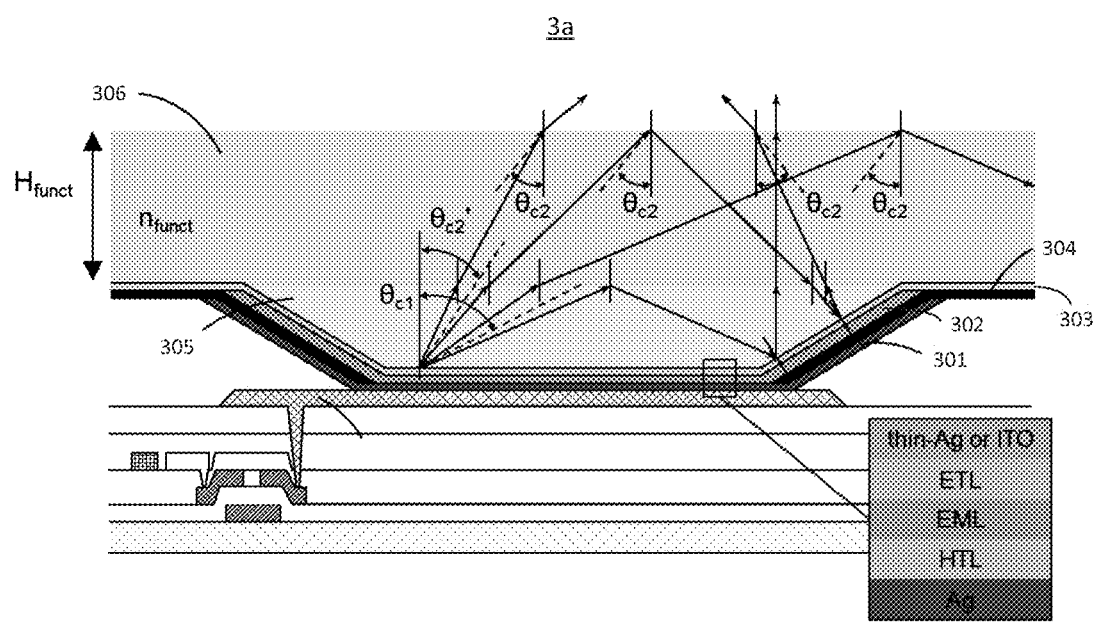
FIG. 6 illustrates another electroluminescent device applied in a 3D AMOLED pixel structure with additional functional layer(s) over the high-index filler and the device/pixel structure according to the first embodiment of the invention in FIG. 1(b).

FIG. 6 depicts pixel and device configurations with additional functional layer(s) over the high-index filler and the device/pixel structure. $\theta_{c1}$ is the critical angle of total internal reflection (TIR) between the filler and the additional functional layer; $\theta_{c2}$ is the critical angle of total internal reflection (TIR) between the additional functional layer and air and $\theta_{c2}'$ is the initial internal angle $\theta_{int}$ in the filler corresponding to $\theta_{c2}$ ($\theta_{c2}'$ indeed also corresponds to the critical angle of total internal reflection (TIR) between the filler and air). Different light ray paths illustrate how light rays entering the filler with an initial internal angle $\theta_{int}$ may propagate in the structure: (i) the light ray with an initial angle $\theta_{int}$ in the filler >$\theta_{c1}$; (ii) the light ray with an initial angle $\theta_{int}$ in the filler <$\theta_{c1}$ (and >$\theta_{c2}'$) and with an angle in the additional functional layer much larger than $\theta_{c2}$ and being guided away and not able to return to the filler region; (iii) the light ray with an initial angle $\theta_{int}$ in the filler <$\theta_{c1}$ (and >$\theta_{c2}'$) and with an angle in the additional functional layer larger than $\theta_{c2}$ and being able to return to the filler region; (iv) the light ray with an initial angle $\theta_{int}$ in the filler <$\theta_{c1}$ (and <$\theta_{c2}'$) and with an angle in the additional functional layer smaller than $\theta_{c2}$ and being out-coupled directly.

FIG. 6 illustrates how a 3D OLED pixel structure 3a can be formed through modifying the OLED pixel structure 3 in FIG. 1 (b); depending on applications of device structures disclosed in this invention, the high-index filler 304 in the device/pixel structure may not be in direct contact with the air and instead be further capped (overcoated or laminated etc.) with one or more layers of some other/additional functionality 306 such as passivation, encapsulation, protection etc., as illustrated in FIG. 6. No matter how many more additional functional layers disposed above, the optical property of the first layer (e.g., its refractive index, $n_{funct}$) in touch with the high-index filler layer is most critical for the overall light-extraction efficiency $\eta_{ext}$ (as long as there is no layer above having a refractive index substantially lower than that of this first layer), since medium-angle light inside the filler (i.e. larger than the filler-air critical angle~32° (assuming $n_{filler}$~1.8) and smaller than the critical angle of the filler and the additional functional layer) can be coupled into such additional functional layer(s), may leak from the sides, and cannot come back into the filler region to be re-directed by the R-bank for out-coupling. In FIG. 6, $\theta_{c1}$ is the critical angle of total internal reflection (TIR) between the filler 305 and the additional functional layer 306; $\theta_{c2}$ is the critical angle of total internal reflection (TIR) between the additional functional layer 306 and air and $\theta_{c2}'$ is the initial internal angle $\theta_{int}$ in the filler 305 corresponding to $\theta_{c2}$ ($\theta_{c2}'$ indeed also corresponds to the critical angle of total internal reflection (TIR) between the filler and air). Different light ray paths in FIG. 6 illustrate how light rays entering the filler with an initial internal angle $\theta_{int}$ may propagate in the structure: (i) the light ray with an initial angle $\theta_{int}$ in the filler >$\theta_{c1}$; (ii) the light ray with an initial angle $\theta_{int}$ in the filler <$\theta_{c1}$ (and >$\theta_{c2}'$) and with an angle in the additional functional layer much larger than $\theta_{c2}$ and maybe being guided away and not able to return to the filler region; (iii) the light ray with an initial angle $\theta_{int}$ in the filler <$\theta_{c1}$ (and >$\theta_{c2}'$) and with an angle in the additional functional layer larger than $\theta_{c2}$ and being able to return to the filler region; (iv) the light ray with an initial angle $\theta_{int}$ in the filler <$\theta_{c1}$ (and <$\theta_{c2}'$) and with an angle in the additional functional layer smaller than $\theta_{c2}$ and being out-coupled directly.

Figure 7:
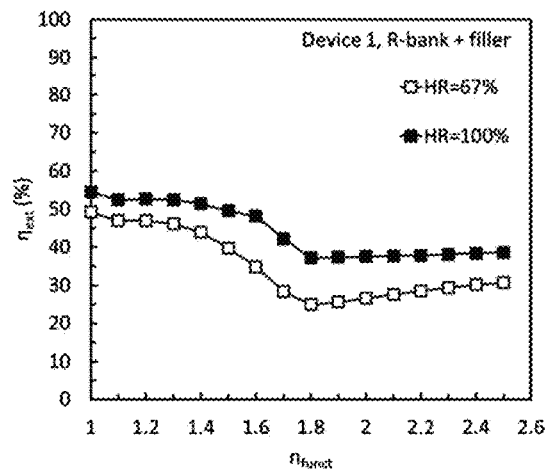
FIGS. 7(a)-7(c) show the out-coupling efficiency $\eta_{ext}$ for devices 1-3 in the R-bank+filler structure as a function of the refractive index $n_{funct}$ of the additional functionality layer for green-emitting devices with HR=67% case and HR=100% case, respectively.
Figure 7:
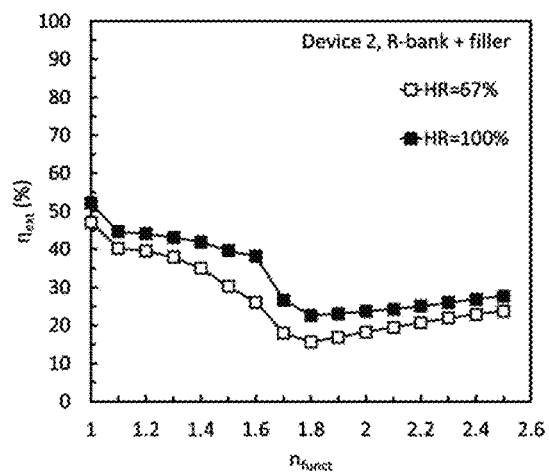
Figure 7:
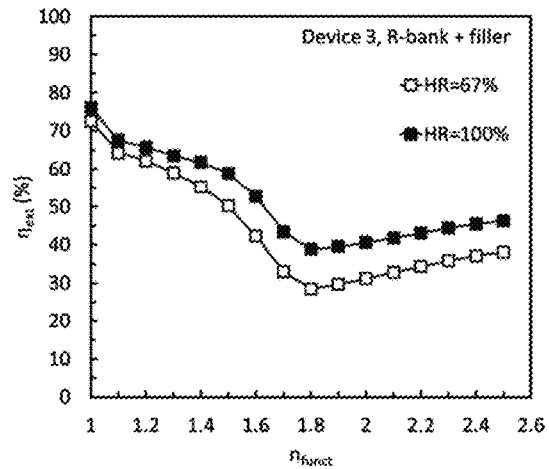

FIGS. 7(a)-7(c) show $\eta_{ext}$ for thin Ag devices 1-2 and ITO device 3 in the R-bank+filler structure as a function of the refractive index $n_{funct}$ of the additional functionality layer (assuming a thickness t=5 µm), for green-emitting devices with HR=67% case and HR=100% case($W_1$=13 µm, H=2 µm, $\theta_B$=30°). It is seen that $\eta_{ext}$ gradually drops as $n_{funct}$ increases, and an abrupt drop of $\eta_{ext}$ occurs around n~1.6 (i.e., around $n_{funct}$=$n_{filler}$−0.2, $n_{filler}$ is the refractive index of the-index filler). Yet, as long as $n_{funct}$≤$n_{filler}$−0.2, most of the enhanced $\eta_{ext}$ (vs. the conventional top-emitting OLED) can be kept.

In comparing HR=67% and HR=100% cases for all thin Ag devices 1-2 and ITO device 3, one notices that in addition to generally higher $\eta_{ext}$ for HR=100% case, the drop of $\eta_{ext}$ with the increase of $n_{funct}$ is reduced/mitigated and $\eta_{ext}$ of all device 1-3 can keep most (more) of their peak values (at $n_{encap}$=1, i.e. the filler is in direct contact with air) till $n_{funct}$~1.5-1.6 (i.e. $n_{funct}$≤$n_{filler}$−0.2, $n_{filler}$), compared to the HR=67% isotropic case. This can be understood with the difference in the angular distribution of radiation coupled into the filler for emitters having different dipole orientations.

Figure 8:
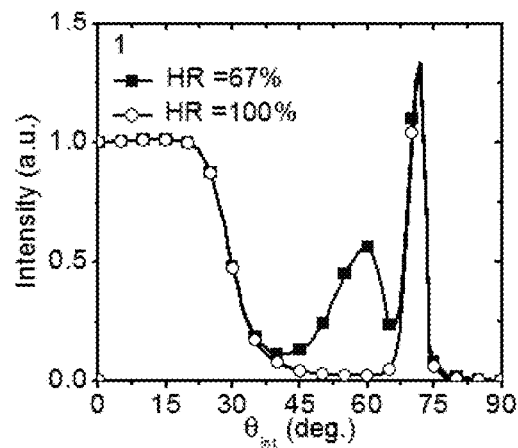
FIGS. 8(a)-8(c) depict spectrally integrated radiation patterns (for total s+p polarizations) coupled into the filler region for devices 1-3, respectively, having either isotropic emitters (HR=67%) or purely horizontal dipole emitters (horizontal dipole ratio HR=100%).
Figure 8:
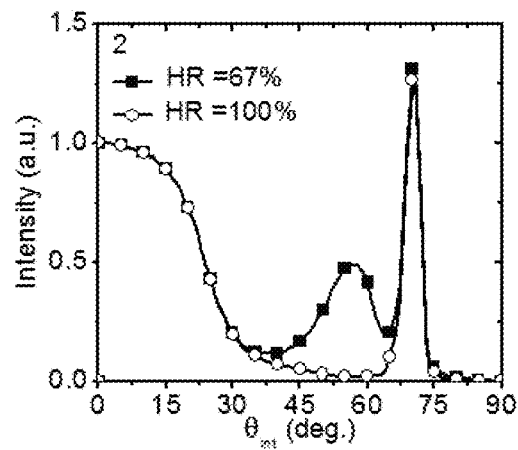
Figure 8:
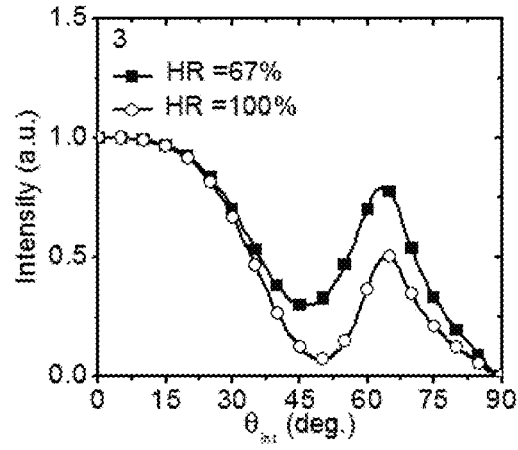

FIGS. 8(a)-8(c) depict spectrally integrated radiation patterns (for total s+p polarizations) coupled into the filler region for thin Ag devices 1-2 and ITO device 3 having either isotropic emitters (HR=67%) or purely horizontal dipole emitters (horizontal dipole ratio HR=100%). For instance, FIGS. 8(a)-8(c) compare the emission patterns (for total s+p polarizations) in the filler for thin Ag devices 1-2 and ITO device 3, having either isotropic emitters (HR=67%) or purely horizontal dipole emitters (horizontal dipole ratio HR=100%). It is seen that with HR=100% (i.e. no vertical emitting dipoles), p-polarization radiation in the 30-60° range that are mainly induced by vertical dipoles is substantially eliminated, resulting a deep dip or nearly flat zero distribution in the angular distribution of the total sum of s+p polarization. Such different angular distributions in the filler could make significant difference in overall light extraction if the filler is not in direct contact with the air and is instead further overcoated or laminated with a thick additional functional layer, as shown in previous FIG. 6, where medium-angle light inside the filler (i.e. larger than the filler-air critical angle~32° (assuming $n_{filler}$~1.8) and smaller than the critical angle of the filler and the additional functional layer) can be coupled into such additional functional layer(s), may leak from the sides, and cannot come back into the filler region to be re-directed by the R-bank for out-coupling. For instance, the critical angle for n=1.8 (filler)/1.5 (additional functional layer) interface is ~56° and with HR=100%, the radiation within angles of 32-60° is almost minimized and thus the portion of emission that can escape from the filler region and the R-bank control (re-direction) is minimized.

Embodiment 7: Methods for Selective/Patterned Deposition of the High-Index Filler Selective/patterned deposition of the high-index filler into or around the concave region may be implemented by a few possible technologies. For instance, some current OLED thin-film encapsulation technology already adopts inkjet printing to deposit (rather thick) polymer precursors in the inorganic/organic multilayer thin-film encapsulation stacks. Such technique may be appropriately adapted for selective/patterned deposition of the high-index filler subsequent to deposition of inorganic passivation/protection layers (such as the common index-matched low-temperature SiNx) over the OLED top electrode, a process that is not so different from current available technologies and may simultaneously provide patterning, encapsulation, and light extraction functionalities. Similar to inkjet printing, vapor-phase jet printing may also be used for patterned deposition of the high-index (organic) filler materials.

In another preferred embodiment, the high-index filler, patterned on the transparent electrode, implies extending the industry's capping layer (CPL) to thicker layer with the CPL or other materials. In some cases, CPL+LiF layer is covered after the top electrode in industry. Subsequent to the CPL or CPL+LiF layer, comes the first layer of the TFE (thin film encapsulation), SiNx, which is then followed by the planarization polymer layer and another SiNx. Placing the filler after SiNx step may lead to better integration scheme, especially if IJP (inkjet printing) is to be used for the filler.

As another instance, very high-resolution patterning of OLED evaporation layers (>1000 ppi) has been recently demonstrated by using planar evaporation sources, very high-resolution shadow masks, and by bringing substrates into close proximity of sources. By evaporation through shadow-mask openings smaller than or similar to the concave area and by utilizing the shadowing effects of evaporation, patterned high-index filler layers with approximate truncated pyramid shape (i.e., tapered layer thickness around the patterned layer edge, as demonstrated by some previous works) for fitting in the concave area shall be feasible. In addition, such proximity evaporation shall substantially raise the material utilization efficiency (thus reduce material cost), not to mention that high-index filler need not be costly active OLED materials.

Figure 9A:
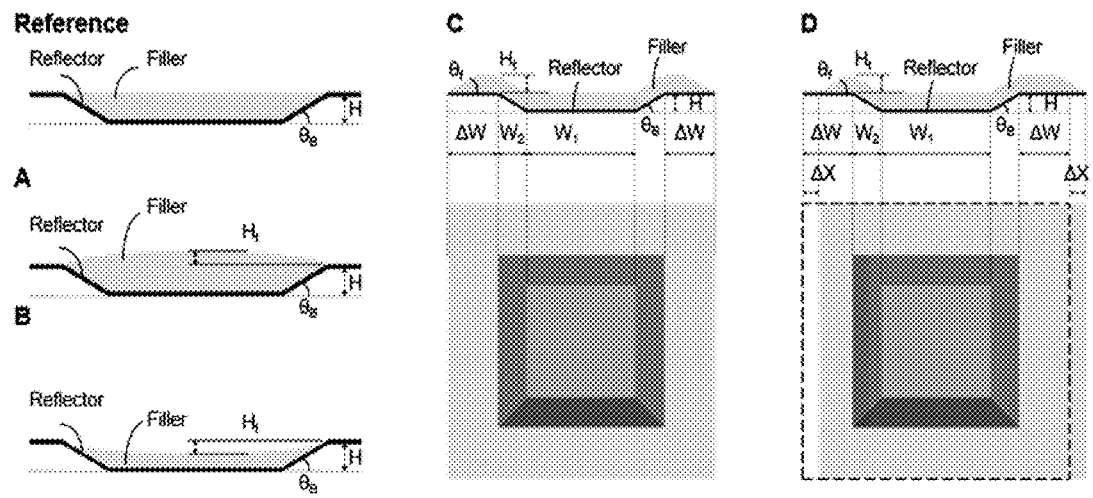
FIGS. 9(a)-9(b) depict the schematic diagrams of various structures.
Figure 9:
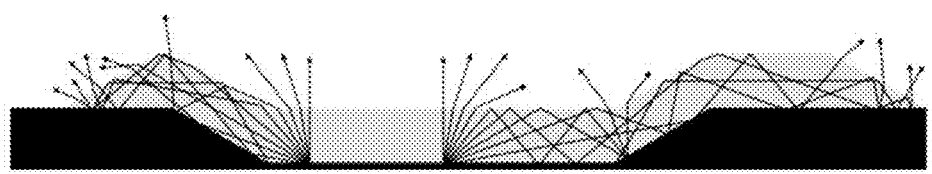

Embodiment 8: Varied Configurations of Selective/Patterned High-Index Filler FIGS. 9(a)-9(b) depict possible variations in implemented pixel/device configurations. FIG. 9(a) shows schematic diagrams of various structures. Reference structure in FIG. 9(a) is like that in FIG. 1(b); structures A and B in FIG. 9(a) represent the cases in which the filler mainly dwells in the concave area ($W_1+2W_2$) but has varied height distributions (thicker or thinner at the center by $H_t$); structures C and D in FIG. 9(a) represent the cases in which the filler layer and the bottom reflector extend over the bank top with a maximal thickness $H_t$ over the bank top, either centering around the concave area (extension ΔW on each side) or shifted/misaligned by ΔX (extension ΔW−ΔX, ΔW+ΔX on each side). $θ_f$ is the tapering angle of the filler layer relative to the bank top around the edge of the filler pattern. FIG. 9(b) shows schematic illustration of how light rays originating from different locations with different initial internal angle $θ_{int}$ in the filler propagate in the reflective bank+filler structure of FIG. 9(a) D and are out-coupled. For simplicity, some structure details, such as additional dielectric, OLED stacks, possible index-matched passivation layer above OLED top electrode etc., are omitted and not explicitly shown in these schematic diagrams.

TABLE 2

Light extraction efficiencies for different structure variations in FIG. 9(a).

| Structure | ΔW (μm) | ΔX (μm) | $H_t$ (μm) | $η_{ext}$ (%) |
|---|---|---|---|---|
| Reference | 0 | 0 | 0 | 72.6 |
| A | 0 | 0 | 0.25 | 71.9 |
|  | 0 | 0 | 0.5 | 71.5 |
| B | 0 | 0 | −0.25 | 73.1 |
|  | 0 | 0 | −0.5 | 73.0 |
| C | 6 | 0 | 0.5 | 68.3 |
|  | 6 | 0 | 2 | 66.6 |
| D | 6 | 0.5 | 0.5 | 68.3 |
|  | 6 | 0.5 | 2 | 66.7 |
|  | 6 | 2 | 0.5 | 68.3 |
|  | 6 | 2 | 2 | 66.8 |

Device 3 OLED stack (including bottom reflective electrode), Color = Green, HR = 67%, R Bank, $θ_B$ = 30°, H = 2 μm, $W_1$ = 13 μm, $θ_f$ = 30°

Actually implemented structures of the selective/patterned filler may vary from that shown in FIG. 1(b) (or reference in FIG. 9(a), like structures A, B, C, D in FIG. 9(a)) schematically shown in FIG. 9(a), but still be capable of providing enhanced and high optical out-coupling efficiencies. In FIG. 9(a), structures A and B represent the cases in which the filler mainly dwells in the concave area ($W_1+2W_2$) but has varied height distributions (thicker or thinner at the center); structures C and D represent the cases in which the filler layer extends over the bank top (with bottom reflector also extended to the bank top), either centering around the concave area (extension ΔW on each side) or shifted/misaligned by ΔX (ΔW−ΔX, ΔW+ΔX on each side). To evaluate their impacts, $η_{ext}$'s of these structures (still $W_1$=13 μm, $θ_B$=30°, H=2 μm) with device 3 OLED stacks (green, isotropic) embedded are calculated and summarized in Table 2. All structures can retain $η_{ext}$'s similar to that of the FIG. 1(b) (reference in FIG. 9(a)) structure (even slightly higher for some cases), except for slight reduction for structures C and D in FIG. 9(a) associated with slightly more reflection loss in some longer ray propagation paths before out-coupling (see FIG. 9(b)). With the filler layer extended to the bank top (thus not completely confined within the bank), some light rays could be guided by the filler to the bank top and be out-coupled there, encountering longer propagation paths and possibly more reflection loss (see FIG. 9(b)). Nevertheless, as long as the filler layer is patterned (not continuous and connected to neighboring pixels), most of radiation entering the filler would still be eventually out-coupled (although the out-coupling mechanism may vary). Overall, results of FIG. 9(a)-9(b) and Table 2 indicate that the proposed light extraction configuration/method is rather tolerant of structure variations, substantially relaxing requirements for perfect or tight control of the filler geometry or topography. Also, as long as the filler layer is patterned, diffusion/leakage of a pixel emission to neighboring pixels (and even out-coupling by neighboring pixels) and thus pixel image blurring usually associated with such phenomena would be minimized.

Embodiment 9: Extended High-Index Filler Layer

Figure 10:
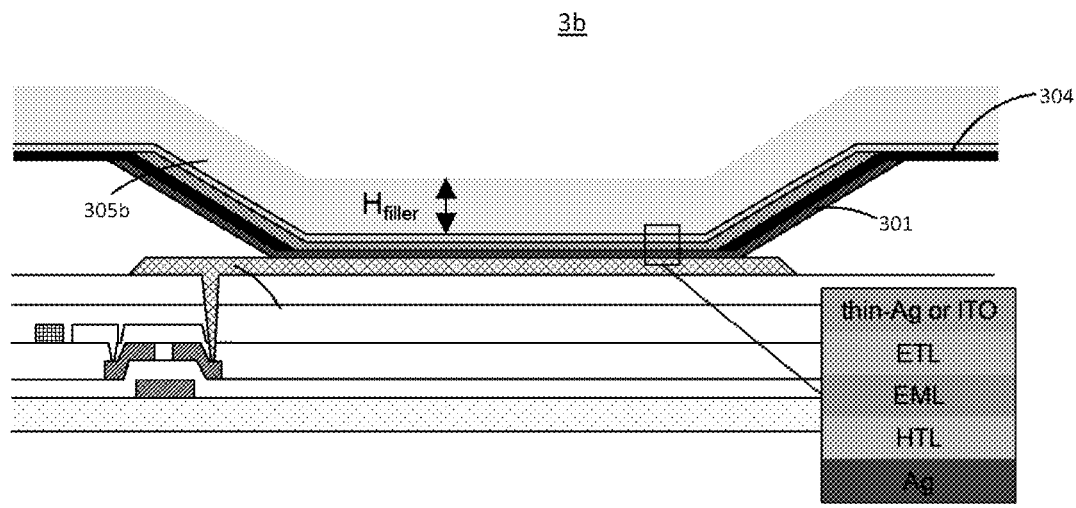
FIG. 10 illustrates another electroluminescent device applied in a 3D AMOLED pixel structure with the extended and selective/patterned high-index filler layer according to the first embodiment of the invention in FIG. 1(b).

FIG. 10 depicts pixel and device configurations 3b with the extended high-index filler layer 305b being disposed not only into the concave area but also be extend over the top of the bank structure. In the previous embodiment examples, the filler material is mainly disposed into or around the concave area and is patterned. In another embodiment, the high-index filler material may be disposed not only into the concave area but also be extended over the top of the bank structure, as illustrated in FIG. 10 (i.e., blanket deposition of the high-index filler over pixels). With more extended filler layers, the structure 3b in FIG. 10 can still give enhanced overall light extraction efficiency $\eta_{ext}$, compared to general top-emitting pixel OLED. Calculated overall light extraction efficiency $\eta_{ext}$'s for the ITO, R-bank, extended filler layer (with thicknesses of 1, 2, 3, μm, $n_{filler}$=1.8) are 37.7%, 37%, and 35%, respectively, assuming isotropic green emitters in OLEDs, HR=67%, $W_1$=13 μm, H=2 μm, $\theta_B$=30° case. With more extended filler layers 305b, the structure 3b in FIG. 10 can also give significantly enhanced overall light extraction efficiency $\eta_{ext}$, in comparison with those of general top-emitting pixel OLEDs in AMOLED displays (~15-18%). In applications, there may be additional functional layers disposed over the extended high-index filler layer (as similar to FIG. 6).

Embodiment 10: Other Types of Electroluminescent Devices

So far, the electroluminescent devices in previous embodiment examples are assumed to be organic electroluminescent devices using organic light-emitting layer(s). The structures in all previous embodiment examples can also be used to substantially enhance light extraction efficiency $\eta_{ext}$ of other types of electroluminescent devices and electroluminescent displays, such as quantum-dot light emitting devices or displays using emitting layer(s) containing emitting quantum dots, perovskite light emitting devices or displays using emitting layer(s) containing emitting perovskite materials. In such different embodiments, the organic electroluminescent devices in previous embodiments are replaced with different electroluminescent devices such as quantum-dot light-emitting devices, perovskite light-emitting devices, thin-film electroluminescent devices etc.

Embodiment 11: Bottom (First) Electrode of Electroluminescent Devices

In certain embodiments, the bottom (first electrode) of the electroluminescent device may be a metal layer, a combination of metal layers, a combination of metal layer(s) and transparent conducting oxide(s).

Embodiment 12: Thickness of the Filler Material Layer

In certain embodiments, the thickness of the filler material layer may be smaller, equal to, or larger than the height of the concave structure (or the depth of the concave structure, H). The filler material layer may be a combination of different high-index materials layers.

Figure 11:
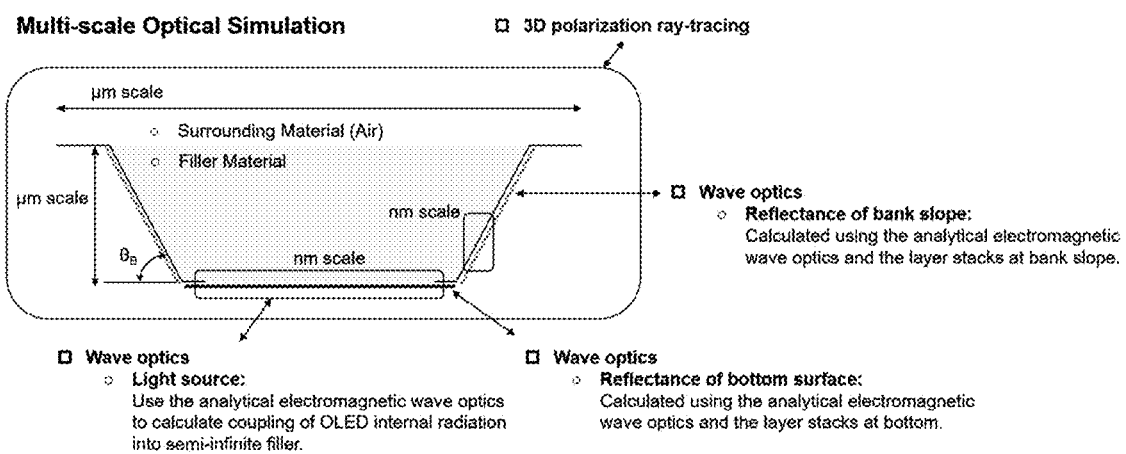
FIG. 11 depicts the multi-scale optical simulation approach used in the electroluminescent device applied in a 3D AMOLED pixel structure according to the first embodiment of the invention in FIG. 1(b).
Figure 12:
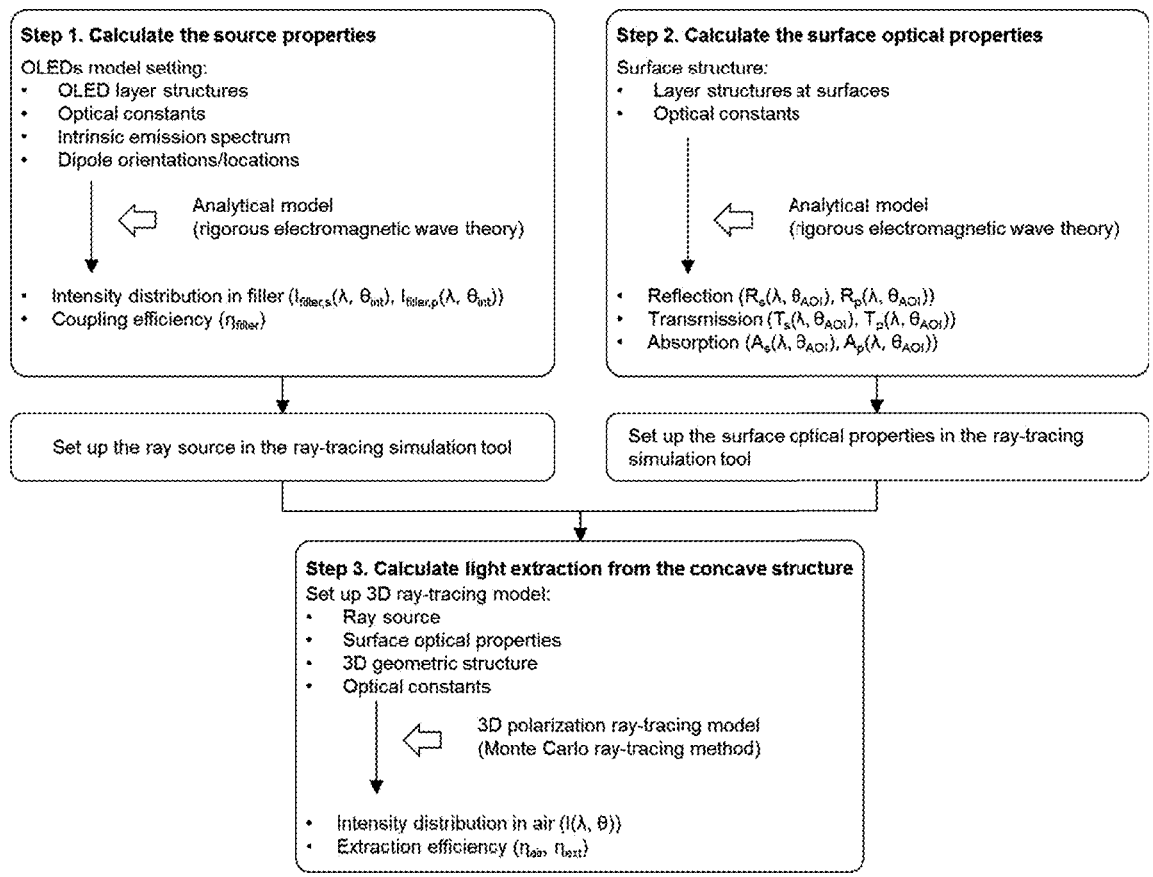
FIG. 12 depicts the flow chart for the optical simulation.
Figure 13:
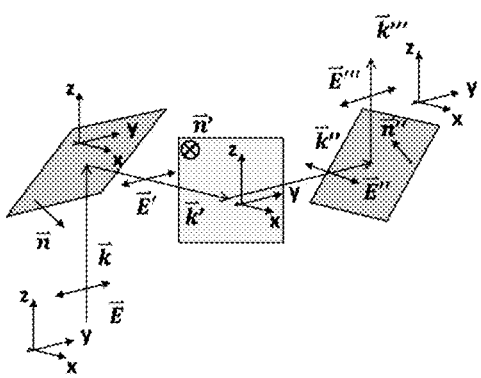
FIGS. 13(a)-13(b) depict the vectors are represented in global coordinates, and in local coordinates, respectively.

FIGS. 11-12 and 13(a)-13(b) describe about more details of optical simulation methods. Since the proposed OLED pixel contains structures of very different dimensional scales, i.e., nm-scale structures that are smaller than wavelengths (e.g., thicknesses of the OLED active layers) and μm-scale structures that are significantly larger than wavelengths (e.g., pixel size, bank height, filler thickness etc.), optical properties of the proposed structure are analyzed with a multi-scale optical simulation, as schematically illustrated in FIG. 11. It combines the rigorous and analytical electromagnetic wave- and dipole-based power dissipation model that is good for dealing detailed emission properties from nm-scale layered structures, with the geometric optics simulation based on Monte Carlo ray tracing that is good for dealing larger-scale structures. The optical modeling/simulation for the proposed structures then contains three steps, as shown in the flow chart of FIG. 12: (1) step 1: calculate the emission properties coupled from the OLED active region into the filler region with the analytical electromagnetic model for use in setting up ray sources in subsequent ray-tracing simulation; (2) step 2: calculate optical properties (reflectance, transmittance) for various surfaces of the proposed structures with the analytical electromagnetic model for use in subsequent ray-tracing simulation; (3) step 3: with inputs from step 1 and step 2, setting up and performing the 3D polarization ray-tracing simulation of the proposed structure.

Step 1: First of all, with the OLED layer stacking structure, and the intrinsic emission spectrum and the emitting dipole orientation of the EML as inputs, the analytical electromagnetic dipole model is used to calculate the coupling of the radiation generated in the OLED active region to the high-index filler region (by assuming it is semi-infinite) as a function of the wavelength λ, the polarization (s, p), and the initial internal angle $\theta_{int}$ in the filler. From such calculation, the light coupling efficiency from the OLED active region to the high-index filler (i.e., $\eta_{filler}$) and the s-polarization/p-polarization/total emission patterns in the filler are obtained. Such radiation intensity distributions in the filler $I_s(\lambda, \theta_{int})$, $I_p(\lambda, \theta_{int})$ as a function of the wavelength λ, the polarization (s, p), and the internal angle $\theta_{int}$ are then used to set up ray sources in the filler for performing the ray-tracing simulation in the larger-scale concave structure (step 3).

The analytical electromagnetic dipole model (the analytical model) used in step 1 for calculating coupling of radiation generated in the OLED active region to the high-index filler region or air (for the top-emitting OLED) adopts a classical approach based on the equivalence between the molecular emission through electronic dipole transitions and the electromagnetic radiation from a classical electrical dipole antenna. Such a model can take into account coupling of OLED emission into SPP and waveguided modes and the loss due to the electrodes. Using the plane-wave expansion of the dipole radiation field, the full-vectorial electromagnetic fields generated by a radiation dipole embedded in a layered structure can be calculated, from which the distribution of the radiation power into different plane-wave modes and the far-field radiation (e.g., coupling of OLED internal radiation into the semi-infinite filler region in proposed OLED structures or into air for the top-emitting OLEDs) related to emission characteristics of the OLED stack can be obtained. In the plane-wave expansion calculation, each plane-wave mode can be characterized by an in-plane wave vector $k_t$, where $k_t$ is the component of the wave vector parallel to the planar layer surface/interface. Emission characteristics of an OLED are calculated by assuming that the emitting layer (EML) contains an ensemble of mutually incoherent dipole radiators with distributions in dipole orientations (e.g., a random isotropic distribution or some anisotropic distributions of the emitting dipoles), locations, and frequencies (e.g., the full spectral distribution from the intrinsic emission spectra of emitting layers). The overall far-field radiation characteristics into the high-index filler region or into air can then be obtained by averaging the contributions over these distributions.

The stack of OLED active layers are assumed to have the general structure of thick Ag bottom reflective electrode (150 nm)/hole-transport layer-HTL (y nm)/emitting layer-EML (10 nm)/electron-transport layer-ETL (x nm)/(semi-)transparent top electrode (either 20 nm Ag or 100 nm ITO). For simplicity of simulation, the optical properties (refractive index n) of the typical organic material CBP (n~1.8 at 520 nm) are assumed for all the HTL, EML, ETL, and filler materials.

Step 2: The optical reflectance, $R_s(\lambda, \theta_{AOI})$ and $R_p(\lambda, \theta_{AOI})$, and optical transmittance, $T_s(\lambda, \theta_{AOI})$, $T_p(\lambda, \theta_{AOI})$, seen from the high-index filler as a function of the polarization (s, p polarization), wavelength $\lambda$, and angle of incidence ($\theta_{AOI}$) for each surface (bottom surface, bank slope surface) of the concave structure, that are needed for ray-tracing simulation in Step 3, are also calculated with the analytical electromagnetic wave theory.

For the bottom surface, the layer structures of Ag bottom electrode (150 nm)/CBP (of corresponding thickness)/(semi-)transparent top electrode (either 20 nm Ag or 100 nm ITO) for thin Ag devices 1-2 and ITO device 3 were used to calculate the optical reflection and transmission seen from the high-index filler. For simplicity, the additional dielectric layer that may be needed to define the actual emission aperture in implementation of the R-bank structure is omitted in most of simulation and discussion, since simulation shows very similar results with or without this additional dielectric layer (see FIG. 11-12 and Table 3). Thus for calculating reflection and transmission of the R-bank slope surface, the layer structures similar to the bottom surface, except for all layer thicknesses being multiplied by cos $\theta_B$ ($\theta_B$ is the bank angle) for taking into account the effect of oblique-angle deposition of material layers onto the bank slope [i.e., Ag bottom electrode (150×cos $\theta_B$ nm)/CBP (of corresponding thickness×cos $\theta_B$)/(semi-)transparent top electrode (either 20×cos $\theta_B$ nm Ag or 100×cos $\theta_B$ nm ITO) for thin Ag devices 1-2 and ITO device 3], were used to calculate the optical reflection and transmission of the bank slope surface seen from the high-index filler. Meanwhile, the layer structures of semi-infinite D-bank/CBP (of corresponding thickness×cos $\theta_B$)/(semi-)transparent top electrode (either 20×cos $\theta_B$ nm Ag or 100×cos $\theta_B$ nm ITO) for thin Ag devices 1-2 and ITO device 3 were used to calculate the optical reflection and transmission of the D-bank slope surface seen from high-index filler.

Table 3. Comparison of light coupling/extraction efficiencies for the R-bank structures with or without the additional dielectric layer (200-nm SiNx) coated over the bank slope for insulation and for defining the emission aperture at the bottom surface.

Step 3: With setting up ray sources (with results of step 1), surface optical properties (with results of step 2) and the geometric structure of the concave structure, the 3-dimensional (3D) polarization Monte Carlo ray-tracing simulation with the LightTools™ software (Synopsys, Inc) is then conducted to calculate extraction of the light from the high-index filler region, taking into consideration the distribution of ray sources as a function of the wavelength $\lambda$, polarization (s, p polarization), and initial internal angle $\theta_{int}$. Eventually the overall light extraction efficiency from the high-index filler to air (i.e., $\eta_{air}$) and the overall out-coupled far-field emission intensity in air [I($\lambda$, $\theta$)] as a function the wavelength $\lambda$ and the external viewing angle $\theta$.

Figure 13B:
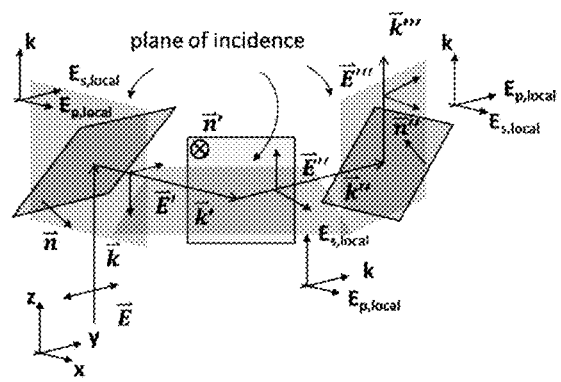

The polarization ray-tracing calculus is adopted in the ray-tracing simulation so that the evolution of the polarization state throughout the whole optical process can be traced and polarization-dependent optical effects (such as intensity distributions of light sources, optical reflectance and transmittance of surfaces, Fresnel loss etc.) can be well taken into account for more accurate simulation and results. In the polarization ray-tracing calculus, the global coordinate system (with specified x, y, z axes as shown in FIG. 13(a)) are used to keep track of evolution of various vector directions (e.g., the ray propagation vector k, the electric field (polarization) vector E) throughout the whole optical process. Meanwhile the local coordinate system for each optical surface/interface, as illustrated in FIG. 13(b), are used to unambiguously partition the polarization states (s or p) of the light ray incident onto that surface/interface and to treat the polarization-dependent processes (e.g., $R_s$, $R_p$, $T_s$, and $T_p$) at that surface/interface separately. The local coordinate system consists of three orthogonal vectors: the propagation vector (k), the vector perpendicular to the incident plane (s polarization direction), and the vector parallel to the incident plane (p polarization direction). As shown in FIG. 13(b), considering a linearly polarized ray with the propagation vector k and the electric field vector E incident on a surface, characteristics of reflected and transmitted rays can be determined by partitioning E into the s component $E_{s,local}$ and the p component $E_{p,local}$ relative to the local coordinate system, treating each component with the polarization-dependent reflectance ($R_s$, $R_p$) and transmittance ($T_s$, $T_p$) of that surface (calculated in step 2), and then combining them to get the electric field vector E'(polarization) of the reflected or transmitted ray (with the propagation vector k') in the global coordinate system that would propagate toward the next surface/interface and undergo another optical process. By repeatedly tracing rays with vector operations alternately in the local and global coordinates till they are out-coupled to the air or lost at some point, the polarization-dependent optical characteristics of the optical system are assessed.

The ray source used for the 3D polarization ray-tracing simulation in step 3 is set up based on calculated radiation intensity distributions $I_s(\lambda, \theta_{int})$, $I_p(\lambda, \theta_{int})$ coupled to the filler region, that are calculated in step 1 and contain the complete wavelength, angular and polarization dependence. In consideration of the singularity issue in the polarization ray-tracing calculus, the ray source in this study is built by using a user-defined polarizer to ensure that the rays pass through it will have the same polarization characteristics calculated from the electromagnetic wave method in step 1. Through the comprehensive 3D polarization ray-tracing simulation with complete consideration of angular, spectral, and polarization dependence of ray sources, the light extraction efficiency from the high-index filler to air (i.e., $\eta_{air}$) and the far-field emission pattern in air $I(\lambda, \theta)$ can be obtained. The overall light extraction efficiency from the OLED active region to air (i.e., $\eta_{ext}$) can then be obtained by $\eta_{ext}=\eta_{filler} \times \eta_{air}$.

FIGS. 14(a)-14(h) depict emission characteristics of the top-emitting device with the thin Ag top electrode (see structure 1 in FIG. 1(a)). The device has a general structure of: reflective Ag bottom electrode (150 nm)/HTL (y nm)/ EML (10 nm)/ETL (x nm)/20-nm Ag/70-nm CBP capping, assuming isotropic green emitters in the EML. FIG. 14 (a) is calculated light extraction efficiencies $\eta_{ext}$ as a function of the HTL and ETL thicknesses. FIGS. 14 (b)-(d) are calculated CIE 1976 (u', v') color coordinates at the 0° viewing angle and the color shift as a function of the HTL and ETL thicknesses. The color shift is defined and calculated as [variance of u'(θ)+variance of v'(θ)], and measures variation of colors over viewing angles. The thick black lines in panels FIGS. 14(a)-14(d) represent the structures with more acceptable color performance (more acceptable CIE 1976 u', v' color coordinates at the 0° viewing angle and minimized color shift). The hollow star with (ETL, HTL)=(65 nm, 200 nm) in FIGS. 14 (a)-14(d) represents the structure with highest $\eta_{ext}$, (~25-26%). The black star with (ETL, HTL)= (55 nm, 178 nm) on the thick black lines in FIGS. 14(a)- 14(d) represents the structure having a lower $\eta_{ext}$ (~16%) compromised with more acceptable color performance. FIG. 14 (e) is calculated emission spectra vs. external viewing angle for the device with highest $\eta_{ext}$ (25-26%) in FIG. 14(a) (i.e., the hollow star with (ETL, HTL)=(65 nm, 200 nm)). FIG. 14 (f) is calculated emission spectra vs. viewing angle for the device having a lower $\eta_{ext}$ (~16%) compromised with more acceptable color performance (i.e., the black star with (ETL, HTL)=(55 nm, 178 nm) in FIG. 14(a)). FIG. 14 (g) shows CIE 1976 (u', v') color coordinates at different viewing angles corresponding to spectra in FIG. 14(e) and FIG. 14(f). FIG. 14(h) shows angular dependence of emission intensity for the two devices in FIG. 14(e) and FIG. 14(f), in comparison with the Lambertian pattern.

FIGS. 15(a)-15(h) show emission characteristics of the top-emitting device with the ITO top electrode (see structure 1 in FIG. 1(a)). The device has a general structure of: reflective Ag bottom electrode (150 nm)/HTL (y nm)/EML (10 nm)/ETL (x nm)/100-nm ITO, assuming isotropic green emitters in the EML. FIG. 15(a) is calculated light extraction efficiencies $\eta_{ext}$ as a function of the HTL and ETL thicknesses. FIGS. 15 (b)-15(d) are calculated CIE 1976 (u', v') color coordinates at the 0° viewing angle and the color shift as a function of the HTL and ETL thicknesses. The color shift is defined and calculated as [variance of u'(θ)+variance of v'(θ)], and measures variation of colors over viewing angles. The thick black lines in panels FIGS. 15 (a)-15(d) represent the structures with more acceptable color performance (more acceptable CIE 1976 u', v' color coordinates at the 0° viewing angle and minimized color shift). The hollow star with (ETL, HTL)=(60 nm, 205 nm) in FIGS. 15 (a)-15(d) represents the structure with highest $\eta_{ext}$, (~30.3%). The black star with (ETL, HTL)=(50 nm, 180 nm) on the thick black lines in FIGS. 15 (a)-15(d) represents the structure having a lower $\eta_{ext}$ (~23.8%) compromised with more acceptable color performance. FIG. 15(e) is calculated emission spectra vs. viewing angle for the device with highest $\eta_{ext}$ (30.3%) in (a) (i.e., the hollow star with (ETL, HTL)=(60 nm, 205 nm)). FIG. 15(f) is calculated emission spectra vs. viewing angle for the device having a lower $\eta_{ext}$ (~23.8%) compromised with acceptable color performance (i.e., the black star with (ETL, HTL)=(50 nm, 180 nm) in FIG. 15 (a)). FIG. 15(g) shows CIE 1976 (u', v') color coordinates at different viewing angles corresponding to spectra in FIGS. 15(e) and 15(f). FIG. 15(h) show angular dependence of emission intensity for the two devices in FIGS. 15(e) and 15(f), in comparison with the Lambertian pattern.

Figure 16:
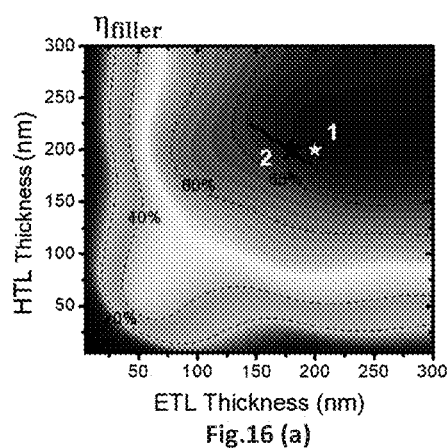
FIG. 16(a) depicts the calculated coupling efficiency into the filler $\eta_{filler}$ as a function of the HTL and ETL thicknesses for the structure 2 with the thin Ag top electrode in FIG. 1(b).
FIGS. 16(b)-16(d) depict the calculated CIE 1976 (u', v') color coordinates at the internal angle $\theta_{int}$=0° and the color shift as a function of the HTL and ETL thicknesses for the structure 2 with the thin Ag top electrode in FIG. 1(b).
Figure 16:
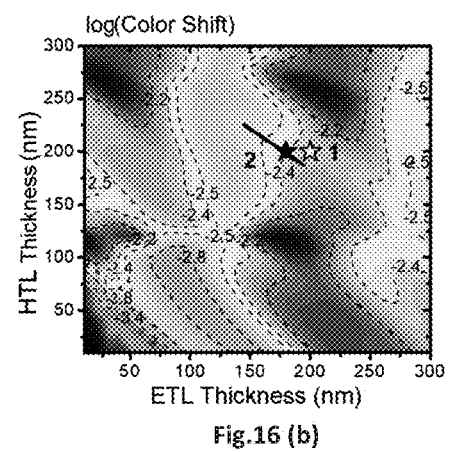
Figure 16:
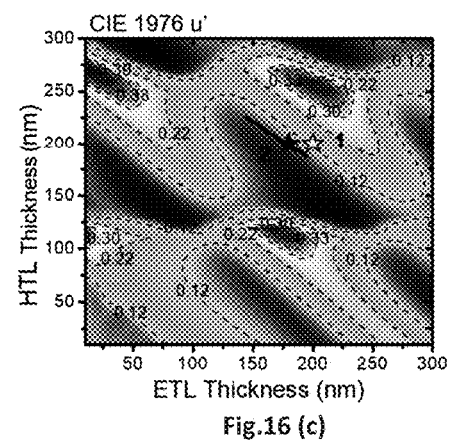
Figure 16:
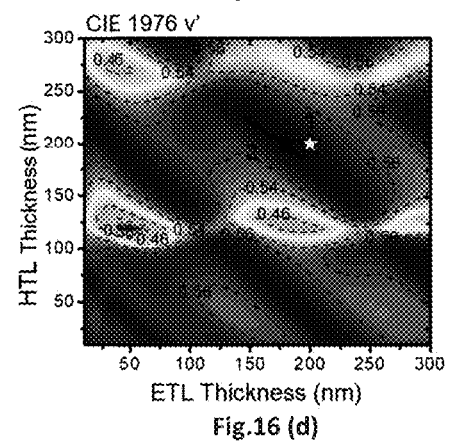

FIGS. 16(a)-16(d) show characteristics of emission coupled into the filler for the device with the thin Ag top electrode (see structure 2 in FIG. 1(b)). The device has a general structure of: reflective Ag bottom electrode (150 nm)/HTL (y nm)/EML (10 nm)/ETL (x nm)/20-nm Ag/semi-infinite CBP, assuming isotropic green emitters in the EML. FIG. 16(a) is calculated coupling efficiency into the filler $\eta_{filler}$ as a function of the HTL and ETL thicknesses. FIGS. 16(b)-16(d) are calculated CIE 1976 (u', v') color coordinates at the internal angle $\theta_{int}=0°$ and the color shift as a function of the HTL and ETL thicknesses. The color shift is defined and calculated as [variance of u'($\theta_{int}$)+variance of v'($\theta_{int}$)], and measures variation of colors over internal angles $\theta_{int}$. The thick black lines in panels FIGS. 16 (a)-16 (d) represent the structures with more acceptable color performance (acceptable CIE 1976 (u', v') color coordinates at the $\theta_{int}=0°$ internal angle and minimized color shift) in the filler. The hollow star with (ETL, HTL)=(200 nm, 200 nm) in FIGS. 16 (a)-16(d) represents the structure with highest $\eta_{filler}$, (~69.8%). The black star with (ETL, HTL)=(180 nm, 200 nm) on the thick black lines in FIGS. 16(a)-16(d) represents the structure having a lower $\eta_{filler}$ (~68.6%) compromised with more acceptable color performance in the filler.

Figures 17A, 17B, 17C:
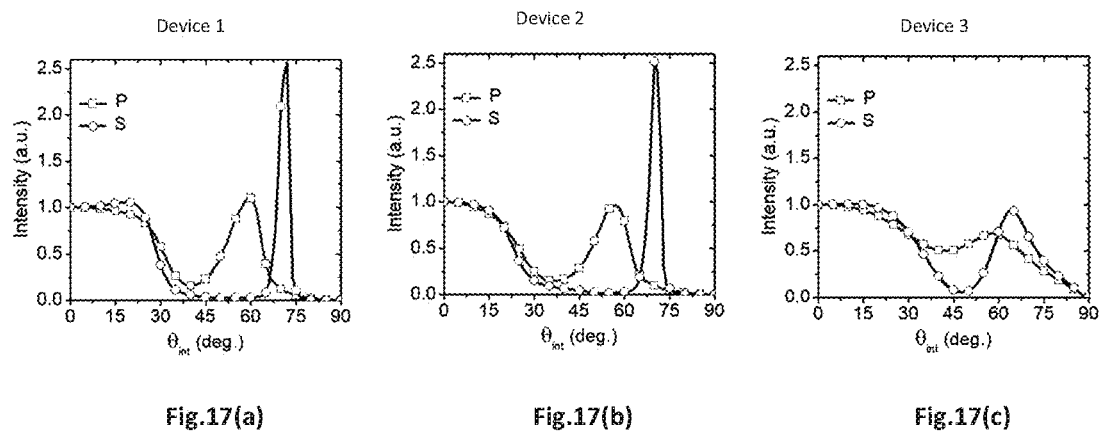
FIGS. 17(a)-17(c) depict the polarization-resolved spectrally integrated emission patterns (p- and s-polarization components) for device 1-3, respectively.

FIGS. 17(a)-17(c) show pixel OLED emission coupled into the high-index filler. FIGS. 17(a)-17(c) depict polarization-resolved spectrally integrated emission patterns (p- and s-polarization components) for device 1(thin Ag structure), device 2(thin Ag structure), and device 3(ITO structure), respectively.

FIG. 18 shows optical reflection properties of surfaces in various bank+filler structures. Calculated $R_s(\lambda, \theta_{AOI})$ and $R_p(\lambda, \theta_{AOI})$ for each surface (bottom surface and bank slope surface) of the concave structure, for device 1(thin Ag structure), device 2(thin Ag structure), and device 3(ITO structure) in either the D-bank+filler structure or the R-bank+filler structure having $\theta_B=30°$ For the bottom surface, the layer structures of Ag bottom electrode (150 nm)/CBP (of corresponding thickness)/(semi-)transparent top electrode (either 20 nm Ag or 100 nm ITO) for device 1(thin Ag structure), device 2(thin Ag structure), and device 3(ITO structure) were used to calculate $R_s$ and $R_p$. For calculating reflection of the R-bank slope surface, the layer structures similar to the bottom surface, except for all layer thicknesses being multiplied by $\cos \theta_B$ for taking into account the effect of oblique-angle deposition (i.e., Ag bottom electrode (150×cos $\theta_B$ nm)/CBP (of corresponding thickness×cos $\theta_B$)/(semi-)transparent top electrode (either 20×cos $\theta_B$ nm Ag or 100×cos $\theta_B$ nm ITO) for devices 1-3), were used. Meanwhile, the layer structures of semi-infinite D-bank/CBP (of corresponding thickness×cos $\theta_B$)/(semi-)transparent top electrode (either 20×cos $\theta_B$ nm Ag or 100× cos θ$_B$ nm ITO) were used to calculate the reflection of the D-bank slope surface seen from high-index filler for devices 1-3.

FIGS. 19(*a*)-19(*b*) show Illustration of re-direction and bouncing reflection of light rays in the bank+filler structure. FIG. 19 (*a*) shows Illustrations of how light rays with any initial θ$_{int}$>θ$_c$ of the filler-air interface are re-directed into the θ$_c$ escape cone for out-coupling in the case with the bank angle θ$_B$=30°. FIG. 19(*b*) shows traces of bouncing reflection of various light rays with different initial θ$_{int}$>θ$_c$ in the bank+filler structures with different θ$_B$.

FIGS. 20(*a*)-20(*d*) depict out-coupled pixel OLED emission for D-bank+filler structures. H=2 μm, θ$_B$=300, W$_1$=13 μm, d=1 μm, 2W$_2$~7 μm, 2W$_3$~5 μm, p=25 μm are assumed. FIG. 20(*a*) shows viewing-angle dependent (spectrally integrated) out-coupled emission intensity for device 1(thin Ag structure), device 2(thin Ag structure), and device 3(ITO structure) in the D-bank+filler structure. The Lambertian pattern is also shown for comparison. FIGS. 20 (*b*)-20(*d*) show viewing-angle dependent out-coupled emission spectra for devices 1, 2, 3 in the D-bank+filler structure. The intrinsic emission spectrum of the emitter (isotropic green emitter) is also shown for comparison.

Figure 21:
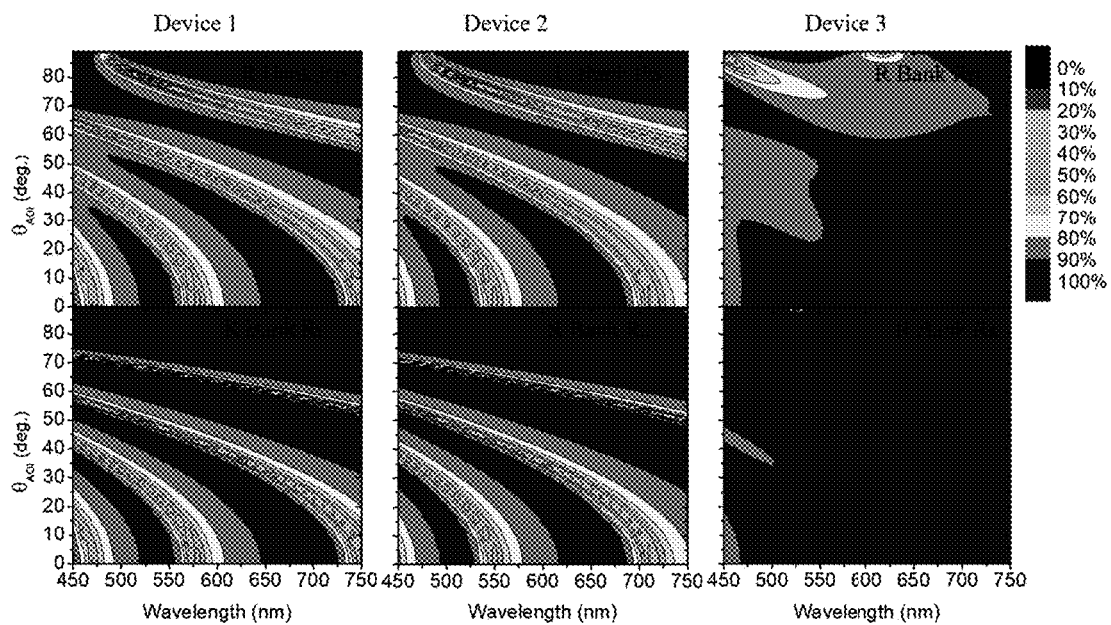
FIG. 21 depicts the calculated $R_s(\lambda, \theta_{AOI})$ and $R_p(\lambda, \theta_{AOI})$ for the R-bank slope surface for device 1-3 in the R-bank+filler structure.

FIG. 21 depicts optical reflection properties of surfaces of R-bank+filler structures with additional dielectric layer over the bank slope reflector. Calculated R$_s$(λ, θ$_{AOI}$) and R$_p$(λ, θ$_{AOI}$) for the R-bank slope surface for device 1(thin Ag structure), device 2(thin Ag structure), and device 3(ITO structure) in the R-bank+filler structure having θ$_B$=30°, with the additional dielectric layer (assuming 200-nm SiNx) coated over the bank slope portion of the bottom Ag electrode for insulation and for defining the emission aperture at the bottom surface of the concave structure. For calculating reflection of the R-bank slope surface, the layer structures of:

Ag bottom electrode (150×cos θ$_B$ nm)/200-nm SiNx/CBP (of corresponding thickness×cos θ$_B$)/(semi-)transparent top electrode (either 20×cos θ$_B$ nm Ag or 100×cos θ$_B$ nm ITO) for devices 1-3, were used. R$_s$ and R$_p$ of the bottom surface and the D-bank surface for devices 1-3, are same those in FIG. 28 and are not shown here.

Figure 22:
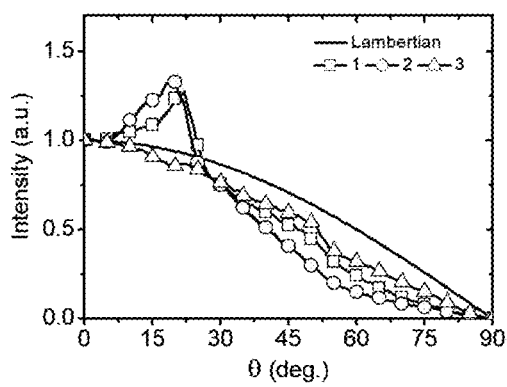
FIG. 22(a) depicts viewing-angle dependent (spectrally integrated) out-coupled emission intensity for devices 1-3 in the R-bank+filler structure with additional dielectric layer over the bank slope reflector.
FIGS. 22(b)-22(d) depict viewing-angle dependent out-coupled emission spectra for devices 1-3 in the R-bank+filler structure with additional dielectric layer over the bank slope reflector, respectively.
Figure 22:
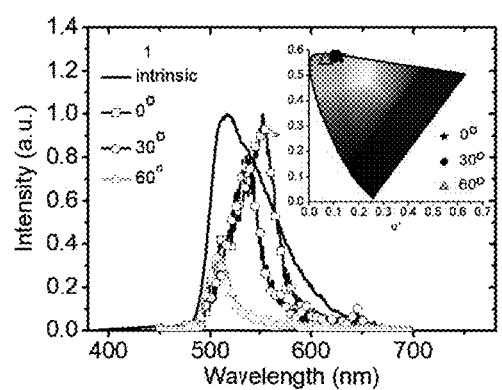
Figure 22:
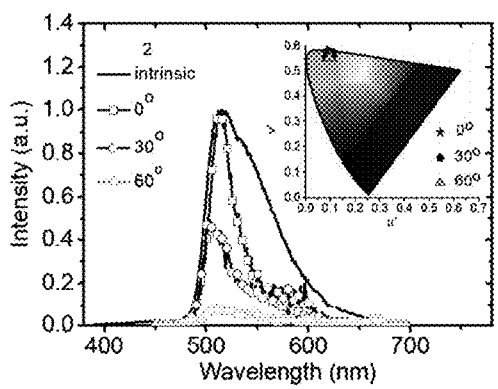
Figure 22:
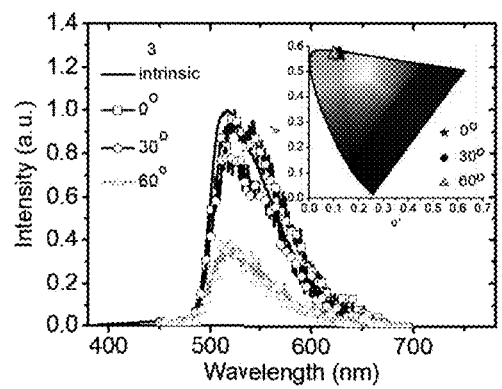

FIGS. 22(*a*)-22(*d*) show out-coupled pixel OLED emission for R-bank+filler structures with additional dielectric layer over the bank slope reflector. H=2 μm, θ$_B$=30°, W$_1$=13 μm, d=1 μm, 2W$_2$~7 μm, 2W$_3$~5 μm, p=25 μm are assumed. Fig. (a) shows out-coupled viewing-angle dependent (spectrally integrated) out-coupled emission intensity for device 1(thin Ag structure), device 2(thin Ag structure), and device 3(ITO structure) in the R-bank+filler structure. The Lambertian pattern is also shown for comparison. FIGS. 22(*b*)-22(*d*) show viewing-angle dependent out-coupled emission spectra for devices 1, 2, 3 in the R-bank+filler structure. The intrinsic emission spectrum of the emitter (assume isotropic green emitter) is also shown for comparison.

FIGS. 23(*a*)-23(*c*) depict influences of structures on out-coupling efficiency of the D-bank+filler structure. FIG. 23(*a*) is calculated η$_{ext}$ as a function of the bank angle θ$_B$ for device 1(thin Ag structure), device 2(thin Ag structure), and device 3(ITO structure) in the D-bank+filler structure with H=2 μm, W$_1$=13 μm, d=1 μm, 2W$_3$=5 μm. FIG. 23(*b*) is calculated η$_{ext}$ as a function of the bank height H for device 1(thin Ag structure), device 2(thin Ag structure), and device 3(ITO structure) in the D-bank+filler structure with θ$_B$=30°, W$_1$=13 μm, d=1 μm, 2W$_3$=5 μm. FIG. 23(*c*) is calculated η$_{ext}$ as a function of the bottom width W$_1$ for device 1(thin Ag structure), device 2(thin Ag structure), and device 3(ITO structure) in the D-bank+filler structure. H=2 μm, θ$_B$=30°, d=1 μm, 2W$_2$=7 μm, 2W$_3$=5 μm.

FIGS. 24(*a*)-24(*d*) show characteristics of red-emitting device with the ITO top electrode (red device 3) in the R-bank+filler structure. H=2 μm, θ$_B$=30°, W$_1$=13 μm, d=1 μm, 2W$_2$~7 μm, 2W$_3$~5 μm, p=25 μm are assumed. FIG. 24(*a*) is calculated η$_{filler}$, the coupling efficiency of the radiation generated in the OLED active region to the high-index filler, as a function of the HTL and ETL thicknesses for the ITO device: Ag(150 nm)/HTL(y nm)/EML(10 nm)/ETL(x nm)/ITO (100 nm)/CBP (semi-infinite), assuming isotropic red emitters in the EML. The hollow star with (ETL, HTL)=(65 nm, 235 nm) in FIG. 24 (*a*) represents the structure with highest η$_{filler}$(~93.7%). FIG. 24(*b*) shows spectrally integrated radiation patterns coupled into the filler region for the device with highest η$_{filler}$. FIG. 24(*c*) shows viewing-angle dependent out-coupled emission spectra for the highest η$_{filler}$ device in the R-bank+filler structure. The hypothetical intrinsic emission spectrum of the red emitter is also shown for comparison. FIG. 24(*d*) depicts out-coupled viewing-angle dependent (spectrally integrated) emission intensity for the highest η$_{filler}$ device in the R-bank+filler structure. The Lambertian pattern is also shown for comparison.

FIGS. 25(*a*)-25(*d*) show characteristics of blue-emitting device with the ITO top electrode (blue device 3) in the R-bank+filler structure. H=2 μm, θ$_B$=30°, W$_1$=13 μm, d=1 μm, 2W$_2$~7 μm, 2W$_3$~5 μm, p=25 μm are assumed. FIG. 25(*a*) is calculated η$_{filler}$, the coupling efficiency of the radiation generated in the OLED active region to the high-index filler, as a function of the HTL and ETL thicknesses for the ITO device: Ag(150 nm)/HTL(y nm)/EML(10 nm)/ETL(x nm)/ITO (100 nm)/CBP (semi-infinite), assuming isotropic blue emitters in the EML. The hollow star with (ETL, HTL)=(65 nm, 180 nm) in FIG. 25(*a*) represents the structure with highest η$_{filler}$ (~83.5%). FIG. 25(*b*) shows spectrally integrated radiation patterns coupled into the filler region for the thr device with highest η$_{filler}$. FIG. 25(*c*) shows viewing-angle dependent out-coupled emission spectra for the highest η$_{filler}$ device in the R-bank+filler structure. The hypothetical intrinsic emission spectrum of the blue emitter is also shown for comparison. FIG. 25(*d*) shows out-coupled viewing-angle dependent (spectrally integrated) emission intensity for the highest η$_{filler}$ device in the R-bank+filler structure. The Lambertian pattern is also shown for comparison.

Figure 26:
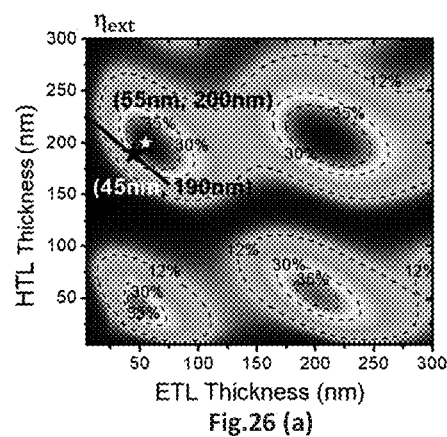
FIGS. 26(a)-26(d) depict the calculated light extraction efficiencies $\eta_{ext}$, calculated CIE 1976 (u', v') color coordinates at the 0° viewing angle and the color shift as a function of the HTL and ETL thicknesses for the structure 1 in FIG. 1(a) with the thin Ag top electrode and 100% horizontal dipole emitters.
Figure 26:
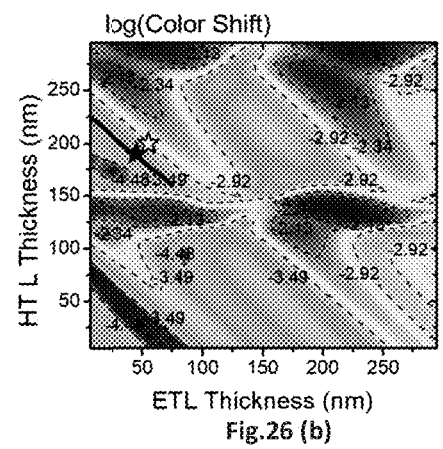
Figure 26:
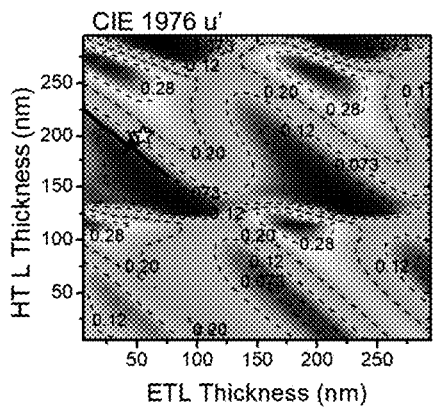
Figure 26:
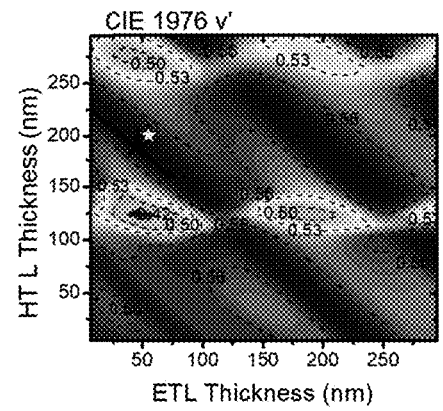
Figure 27:
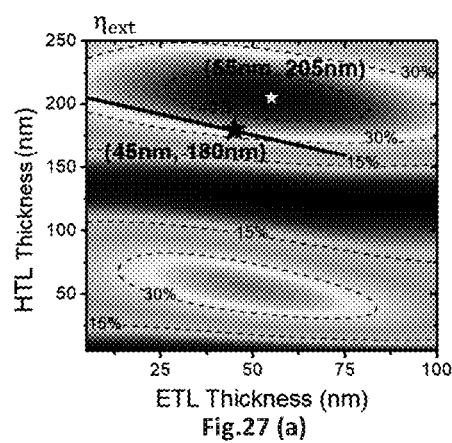
FIGS. 27(a)-27(d) depict the calculated light extraction efficiencies $\eta_{ext}$, calculated CIE 1976 (u', v') color coordinates at the 0° viewing angle and the color shift as a function of the HTL and ETL thicknesses for the structure 1 in FIG. 1(a) with the ITO top electrode and 100% horizontal dipole emitters.
Figure 27:
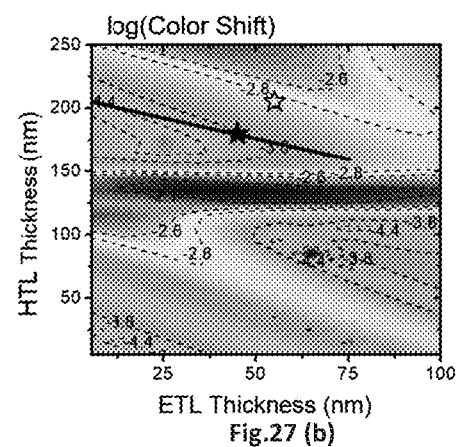
Figure 27:
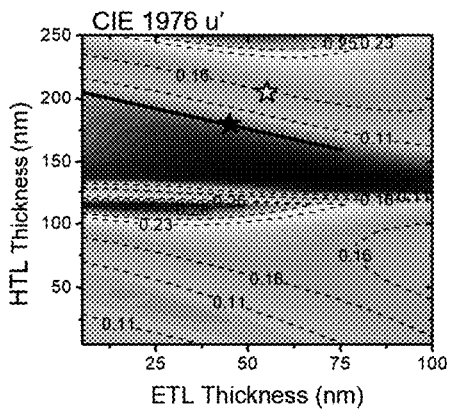
Figure 27:
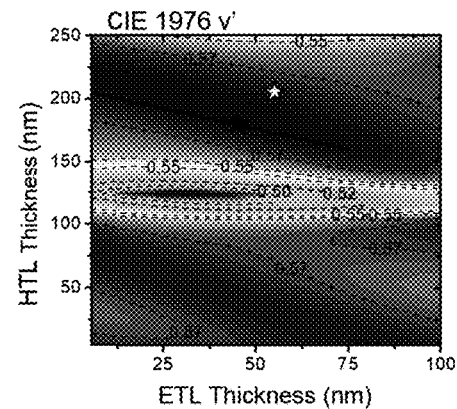

FIGS. 26(*a*)-26(*d*) show emission characteristics of the top-emitting device (see structure 1 in FIG. 1(*a*)) with the thin Ag top electrode and 100% horizontal dipole emitters. The device has a general structure of: reflective Ag bottom electrode (150 nm)/HTL (y nm)/EML (10 nm)/ETL (x nm)/20-nm Ag/70-nm CBP capping, assuming green emitters with a 100% horizontal dipole ratio in the EML. FIG. 26(*a*) is calculated light extraction efficiencies η$_{ext}$ as a function of the HTL and ETL thicknesses. FIGS. 26(*b*)-26(*d*) are calculated CIE 1976 (u', v') color coordinates at the 0° viewing angle and the color shift as a function of the HTL and ETL thicknesses. The color shift is defined and calculated as [variance of u'(θ)+variance of v'(θ)], and measures variation of colors over viewing angles. The thick black lines in panels FIGS. 26(*a*)-26(*d*) represent the structures with more acceptable color performance (more acceptable CIE 1976 u', v' color coordinates at the 0° viewing angle and minimized color shift). The hollow star with (ETL, HTL)=(55 nm, 200 nm) in FIGS. 26(*a*)-26(*d*) represents the structure with highest η$_{ext}$ (41.3%). The black star with (ETL, HTL)=(45 nm, 190 nm) on the thick black lines in FIGS.

26(a)-26(d) represents the structure having a lower $\eta_{ext}$ (~34.1%) compromised with more acceptable color performance.

FIGS. 27(a)-27(d) show emission characteristics of the top-emitting device (see structure 1 in FIG. 1(a)) with the ITO top electrode and 100% horizontal dipole emitters. The device has a general structure of: reflective Ag bottom electrode (150 nm)/HTL (y nm)/EML (10 nm)/ETL (x nm)/100-nm ITO, assuming green emitters with a 100% horizontal dipole ratio in the EML. FIG. 27(a) is calculated light extraction efficiencies $\eta_{ext}$ as a function of the HTL and ETL thicknesses. FIGS. 27(b)-27(d) are calculated CIE 1976 (u', v') color coordinates at the 0° viewing angle and the color shift as a function of the HTL and ETL thicknesses. The color shift is defined and calculated as [variance of u'(θ)+variance of v'(θ)], and measures variation of colors over viewing angles. The thick black lines in panels FIGS. 27(a)-(d) represent the structures with more acceptable color performance (more acceptable CIE 1976 u', v' color coordinates at the 0° viewing angle and minimized color shift). The hollow star with (ETL, HTL)=(55 nm, 205 nm) in (a)-(d) represents the structure with highest $\eta_{ext}$ (~43.3%). The black star with (ETL, HTL)=(45 nm, 180 nm) on the thick black lines in FIGS. 27(a)-27(d) represents the structure having a lower $\eta_{ext}$ (~34.5%) compromised with more acceptable color performance.

Figure 28A:
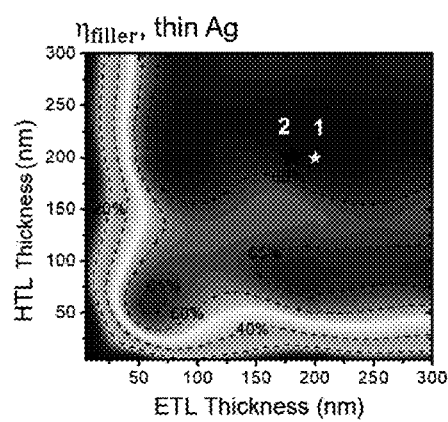
FIGS. 28(a)-28(b) depict the calculated $\eta_{filler}$ for green-emitting devices with thin Ag top electrode and ITO top electrode, respectively.
Figure 28B:
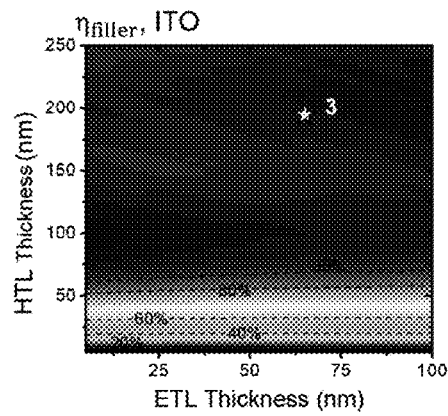

FIGS. 28(a)-28(b) are calculated $\eta_{filler}$ for green-emitting devices (thin Ag device and ITO device) with 100% horizontal dipole emitters. FIG. 28(a) is calculated $\eta_{filler}$, the coupling efficiency of the radiation generated in the OLED active region to the high-index filler, as a function of the HTL and ETL thicknesses for the device with thin Ag top electrode: Ag(150 nm)/HTL(y nm)/EML(10 nm)/ETL(x nm)/Ag (20 nm)/CBP (semi-infinite), assuming 100% horizontal dipole emitters (green emitting) in the EML. The hollow star with (ETL, HTL)=(200 nm, 200 nm) in FIG. 28(a) represents the structure with highest $\eta_{filler}$ (~70%). FIG. 28(b) is calculated $\eta_{filler}$, the coupling efficiency of the radiation generated in the OLED active region to the high-index filler, as a function of the HTL and ETL thicknesses for the device with ITO top electrode: Ag(150 nm)/HTL(y nm)/EML(10 nm)/ETL(x nm)/ITO (100 nm)/CBP (semi-infinite), assuming 100% horizontal dipole emitters (green emitting) in the EML. The hollow star with (ETL, HTL)=(65 nm, 195 nm) in FIG. 28(b) represents the structure with highest $\eta_{filler}$ (~88.4%).

What is claimed is:

1. An organic electroluminescent device, comprising:
   a total-optical reflective concave electrode, comprising:
      a first total-optical reflective surface; and
      a second total-optical reflective surface, intersecting said first total-optical reflective surface at an obtuse angle, wherein the obtuse angle between the first and second total-optical reflective surfaces is from 125° to 170°;
   an organic active layer in direct contact with said first total-optical reflective surface, comprising:
      a first organic active surface, parallel to and separated from said first total-optical reflective surface;
      a second organic active surface, parallel to and separated from said second total-optical reflective surface; and
      an electroluminescent area, disposed entirely within said first organic active surface, between said first total-optical reflective surface and said first organic active surface, without directly contacting any of said second total-optical reflective surface and said second organic active surface;
   a transparent electrode, disposed on the organic active layer; and,
   a first light propagation layer, disposed on the transparent electrode.

2. The organic electroluminescent device of claim 1, wherein the intersection obtuse angle between the first and second optically reflective surfaces is from 140° to 170°.

3. The organic electroluminescent device of claim 1, wherein the ratio $H/W_1$ between a diameter $W_1$ of the first total-optical reflective surface and a height H of the second total-optical reflective surface is larger than 0.62.

4. The organic electroluminescent device of claim 1, further comprising a second light propagation layer, disposed on the first light propagation layer, the second light propagation layer $n_{funct}$ has a smaller than said first light propagation layer $n_{filler}$ minus 0.2.

5. The organic electroluminescent device of claim 1, wherein the first light propagation layer is patterned on the transparent electrode.

6. The organic electroluminescent device of claim 5, wherein the first light propagation layer is patterned by evaporation through shadow-mask openings smaller than or similar to the first total-optical reflective surface and by utilizing the shadowing effects of evaporation.

7. The organic electroluminescent device of claim 5, wherein a capping layer or a capping layer with LiF is placed on the transparent electrode, then the first layer of a TFE (thin film encapsulation) and SiNx are placed on the capping layer or the capping layer with LiF, then a planarization polymer layer and another SiNx are placed on the first layer of TFE and SiNx, and then the first light propagation layer is placed after said another SiNx by inkjet printing.

8. The organic electroluminescent device of claim 1, further comprising a third surface adjoining said second total-optical reflective surface and parallel to said first total-optical reflective surface, a dielectric layer having a first dielectric surface and a second dielectric surface, the first dielectric surface is disposed between the second total-optical reflective surface and the second organic active surface, and the second dielectric surface is extended and parallel to the third surface.

9. The organic electroluminescent device of claim 8, wherein the first light propagation layer is extended over the third surface.

10. The organic electroluminescent device of claim 1, wherein the organic active layer further comprises a light emitting layer, the horizontal dipole ratios of the material of the light emitting layer is larger than 67%.

11. The organic electroluminescent device of claim 1, wherein the total-optical reflective concave electrode is made of a material selected from the group consisting of metal, transparent conductive metal-oxide, transparent dielectric, scattering reflector, distributed Bragg reflector formed by alternate stacking of high-index/low-index materials, their stacking and their combinations.

12. A display pixel structure using said organic electroluminescent device of claim 1, comprising:
   a substrate;
   a thin-film transistor, formed on the substrate; and
   an interconnection conductor, electrically connected to the thin-film transistor,
   wherein said organic electroluminescent device electrically connects to the interconnection conductor via the first optically reflective surface.

13. The display pixel structure of claim 12, wherein the interconnection conductor also serves as the first total-optical reflective surface.

14. An organic electroluminescent device, comprising:
an optically reflective concave structure, comprising:
a first optically reflective surface; and
a second optically reflective surface, intersecting said first surface at an obtuse angle, wherein the obtuse angle between the first and second optically reflective surfaces is from 125° to 170°;
a total-optical reflective electrode, disposed on the first surface;
an organic active layer in direct contact with said total-optical reflective electrode, comprising:
a first organic active surface, parallel to and separated from said first surface;
a second organic active surface, parallel to and separated from said second optically reflective surface; and
an electroluminescent area, disposed entirely within said first organic active surface, between said total-optical reflective electrode and said first organic active surface;
a transparent thin-metal electrode, disposed on the organic active layer; and,
a light propagation layer, disposed on the transparent thin-metal electrode.

15. The organic electroluminescent device of claim 14, wherein the optically reflective concave structure consists of a material selected from the group consisting of metal and scattering reflector.

16. The organic electroluminescent device of claim 14, wherein the optically reflective concave structure is made of a material selected from the group consisting of metal, transparent conductive metal-oxide, transparent dielectric, scattering reflector, distributed Bragg reflector formed by alternate stacking of high-index/low-index materials, their stacking and their combinations.

17. The organic electroluminescent device of claim 14, wherein a material of the first optically reflective surface is different from a material of the second optically reflective surface.

18. The organic electroluminescent device of claim 14, wherein the ratio $H/W_1$ between a diameter $W_1$ of the first optically reflective surface and a height H of the second optically reflective surface is larger than 0.62.

19. The organic electroluminescent device of claim 14, further comprising a second light propagation layer, disposed on the first light propagation layer, the second light propagation layer $n_{funct}$ has a smaller than said first light propagation layer $n_{filler}$ minus 0.2.

20. The organic electroluminescent device of claim 14, wherein the first light propagation layer is patterned on the transparent electrode.

21. The organic electroluminescent device of claim 20, wherein a capping layer or a capping layer with LiF is placed on the transparent electrode, then the first layer of a TFE (thin film encapsulation) and SiNx are placed on the capping layer or the capping layer with LiF, then a planarization polymer layer and another SiNx are placed on the first layer of TFE and SiNx, and then the first light propagation layer is placed after said another SiNx by inkjet printing.

22. The organic electroluminescent device of claim 14, further comprising a third surface adjoining said second optically reflective surface and parallel to said first optically reflective surface, the first light propagation layer is extended over the third surface.

23. The organic electroluminescent device of claim 14, wherein the organic active layer further comprises a light emitting layer, the horizontal dipole ratios of the material of the light emitting layer is larger than 67%.

* * * * *